United States Patent
Lassalle-Balier et al.

(10) Patent No.: US 12,130,342 B2
(45) Date of Patent: Oct. 29, 2024

(54) MAGNETIC FIELD CURRENT SENSOR TO REDUCE STRAY MAGNETIC FIELDS

(71) Applicant: Allegro MicroSystems, LLC, Manchester, NH (US)

(72) Inventors: Rémy Lassalle-Balier, Bures sur Yvette (FR); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 218 days.

(21) Appl. No.: 17/806,336

(22) Filed: Jun. 10, 2022

(65) Prior Publication Data
US 2023/0400537 A1    Dec. 14, 2023

(51) Int. Cl.
*G01R 33/09*    (2006.01)
*G01R 15/20*    (2006.01)

(52) U.S. Cl.
CPC ......... *G01R 33/098* (2013.01); *G01R 15/205* (2013.01); *G01R 33/091* (2013.01)

(58) Field of Classification Search
CPC ... G01R 15/205; G01R 33/098; G01R 33/091
See application file for complete search history.

(56) References Cited

U.S. PATENT DOCUMENTS

| | | |
|---|---|---|
| 5,216,560 A | 6/1993 | Brug et al. |
| 5,561,368 A | 10/1996 | Dovek et al. |
| 5,753,914 A * | 5/1998 | Ikegami ............. G01N 23/2209 250/307 |
| 6,166,539 A | 12/2000 | Dahlberg et al. |
| 6,501,678 B1 | 12/2002 | Lenssen et al. |
| 7,064,937 B2 | 6/2006 | Wan et al. |
| 7,259,545 B2 | 8/2007 | Stauth et al. |
| 7,838,133 B2 | 11/2010 | Zhang et al. |
| 8,269,491 B2 | 9/2012 | Cummings et al. |
| 9,046,562 B2 | 6/2015 | Cummings et al. |
| 9,465,056 B2 | 10/2016 | Han et al. |

(Continued)

FOREIGN PATENT DOCUMENTS

| | | |
|---|---|---|
| EP | 2589975 A2 | 5/2013 |
| EP | 2752676 A1 | 7/2014 |
| JP | 2015-219058 A | 12/2015 |

OTHER PUBLICATIONS

U.S. Appl. No. 15/869,620, filed Jan. 12, 2018, Cadugan et al.
(Continued)

*Primary Examiner* — Alesa Allgood
(74) *Attorney, Agent, or Firm* — Daly, Crowley, Mofford & Durkee, LLP

(57) ABSTRACT

In one aspect, a magnetic field current sensor includes an annihilation detector. The annihilation detector includes an annihilation bridge that includes magnetoresistance elements. The annihilation detector also includes a current bridge that includes at least two of the magnetoresistance elements, a first comparator configured to compare an output signal from the annihilation bridge and a second comparator configured to compare an output signal from the current bridge. An output of the annihilation detector indicates whether an annihilation exists in one or more of the magnetoresistance elements using at least one of the outputs signals of the first and second comparators.

9 Claims, 21 Drawing Sheets

(56) References Cited

U.S. PATENT DOCUMENTS

| | | | |
|---|---|---|---|
| 10,060,880 | B2 | 8/2018 | Chen et al. |
| 10,746,820 | B2 | 8/2020 | Lassalle-Balier et al. |
| 11,719,527 | B2 | 8/2023 | Lassalle-Balier |
| 2008/0258721 | A1 | 10/2008 | Guo et al. |
| 2009/0237075 | A1 | 9/2009 | Koss |
| 2010/0007344 | A1 | 1/2010 | Guo et al. |
| 2010/0277971 | A1 | 11/2010 | Slaughter et al. |
| 2014/0253106 | A1 | 9/2014 | Granig et al. |
| 2015/0022196 | A1 | 1/2015 | Hebiguchi et al. |
| 2015/0177286 | A1 | 6/2015 | Fuji et al. |
| 2015/0198679 | A1 | 7/2015 | Ausserlechner |
| 2015/0333254 | A1 | 11/2015 | Liu et al. |
| 2016/0209479 | A1 | 7/2016 | Hegedus |
| 2016/0359103 | A1 | 12/2016 | Fermon et al. |
| 2017/0314969 | A1 | 11/2017 | Ausserlechner et al. |
| 2018/0087889 | A1 | 3/2018 | Ausserlechner et al. |
| 2018/0164387 | A1* | 6/2018 | Raberg ................. G01R 33/098 |
| 2018/0372810 | A1 | 12/2018 | Jiang et al. |
| 2020/0116800 | A1* | 4/2020 | Lassalle-Balier ........................... G01R 33/0035 |
| 2020/0333407 | A1* | 10/2020 | Reimann ............... G01R 33/022 |
| 2021/0285794 | A1 | 9/2021 | Briano et al. |
| 2022/0278660 | A1* | 9/2022 | Uekura ................... H03F 3/387 |
| 2023/0332878 | A1 | 10/2023 | Lassalle-Balier et al. |

OTHER PUBLICATIONS

U.S. Appl. No. 15/895,418, filed Feb. 13, 2018, Cadugan et al.
U.S. Appl. No. 16/157,313, filed Oct. 11, 2018, Lassalle-Balier, et al.
Allegro MicroSystems, LLC, "High Sensitivity, 1 MHZ, GMR-Based Current Sensor IC in Space-Saving Low Resistance QFN Package;" ACS 70331 Datasheet dated Nov. 3, 2017; 22 Pages.
Pigeau, "Magnetic Vortex Dynamics Nanostructures;" HAL Open Science, Université Paris Sud; Submitted on Jan. 22, 2013; 85 Pages (Part 1 of 2).
Pigeau, "Magnetic Vortex Dynamics Nanostructures;" HAL Open Science, Université Paris Sud; Submitted on Jan. 22, 2013; 84 Pages (Part 2 of 2).
U.S. Notice of Allowance dated Aug. 22, 2019 for U.S. Appl. No. 15/869,620; 11 Pages.
U.S. 1$^{st}$ Notice of Allowance dated Aug. 8, 2019 for U.S. Appl. No. 15/895,418; 10 Pages.
Amendment and Request for Continued Examination (RCE) dated Sep. 30, 2019 for U.S. Appl. No. 15/895,418; 27 Pages.
U.S. 2$^{nd}$ Notice of Allowance dated Dec. 23, 2019 for U.S. Appl. No. 15/895,418; 13 pages.
U.S. Notice of Allowance dated Mar. 12, 2020 for U.S. Appl. No. 16/157,313; 14 Pages.
Extended European Search Report dated Mar. 3, 2020 for European Application No. 19202154.1; 7 Pages.
Response to Extended European Search Report dated Mar. 3, 2020 for European Application No. 19202154.1; Response filed Oct. 15, 2020; 114 Pages.
U.S. Preliminary Amendment filed on Nov. 1, 2018 for U.S. Appl. No. 16/157,317; 34 Pages.
U.S. Non-Final Office Action dated Feb. 3, 2020 for U.S. Appl. No. 16/157,317; 11 Pages.
Response to U.S. Non-Final Office Action dated Feb. 3, 2020 for U.S. Appl. No. 16/157,317; Response filed Apr. 16, 2020; 17 Pages.
U.S. Notice of Allowance dated Jun. 23, 2020 for U.S. Appl. No. 16/157,317; 7 Pages.
European Examination Report dated Mar. 23, 2022 for European Application No. 19 202 154.1; 5 pages.
Search Report and Written Opinion dated Aug. 21, 2023 for PCT Application No. PCT/US2023/064522; 22 pages.
PCT Invitation to Pay Additional Fee's and Partial International Search Report dated Jun. 15, 2023 for International Application No. PCT/US2023/064522; 14 Pages.
Mathon, "Theory of Tunneling Magnetoresistance;" Journal Article from Phase Transitions, vol. 76, Nos. 4-5; Jan. 2003; pp. 491-500; 11 Pages.
U.S. Appl. No. 18/333,680, filed Jun. 13, 2023, Jaiswal.
U.S. Appl. No. 18/511,743, filed Nov. 16, 2023, Campiglio et al.
Response to Examination Report dated dated Mar. 23, 2022, filed on Jul. 26, 2022 for European Application No. 19 202 154.1; 38 pages.
Intention to Grant dated Mar. 14, 2024, for European Application No. 19202154.1, 7 pages.

\* cited by examiner

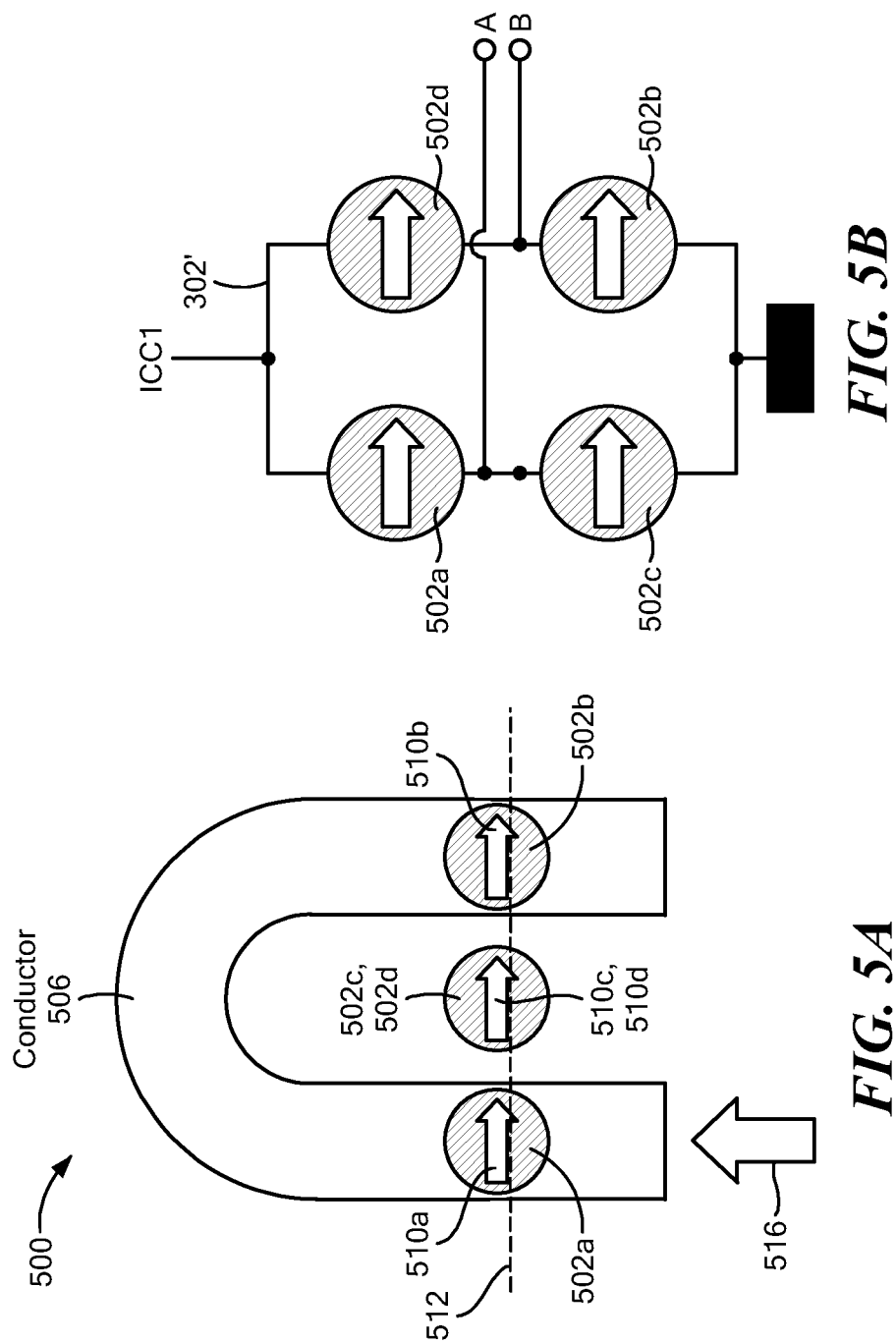

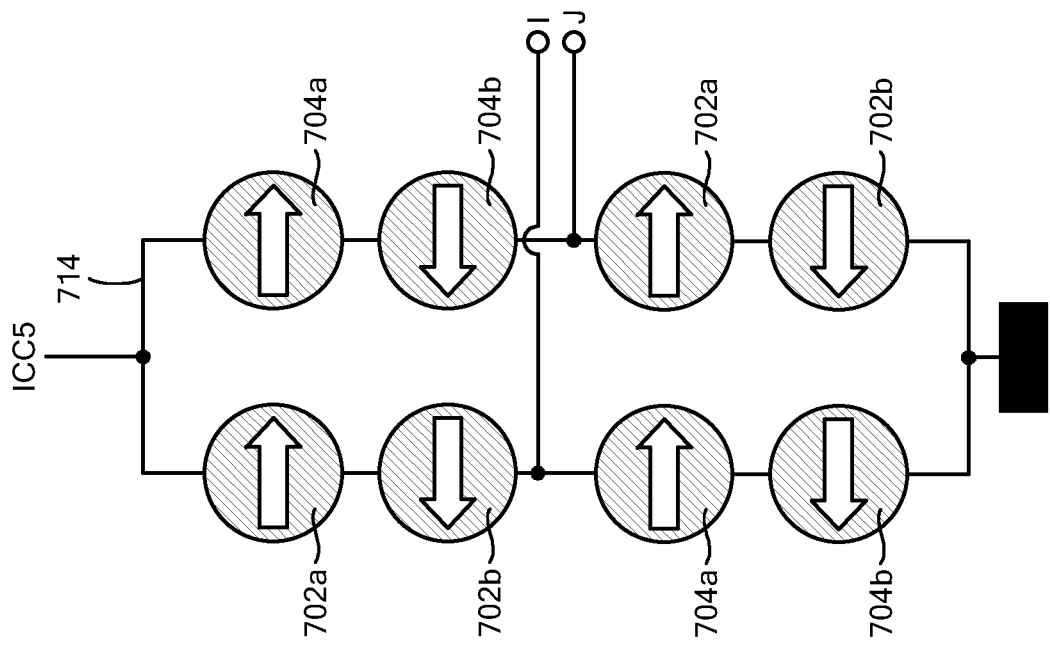
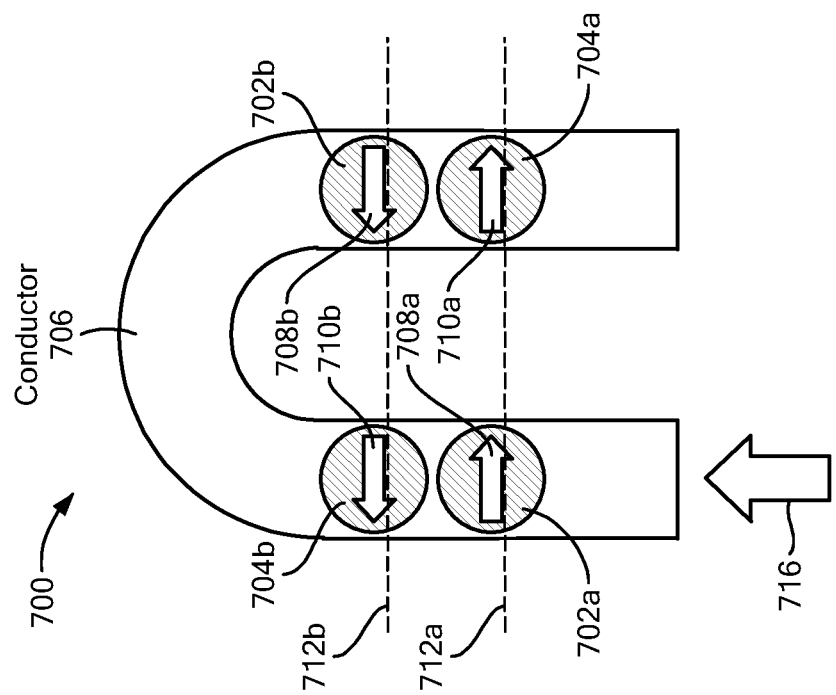
FIG. 7B
FIG. 7A

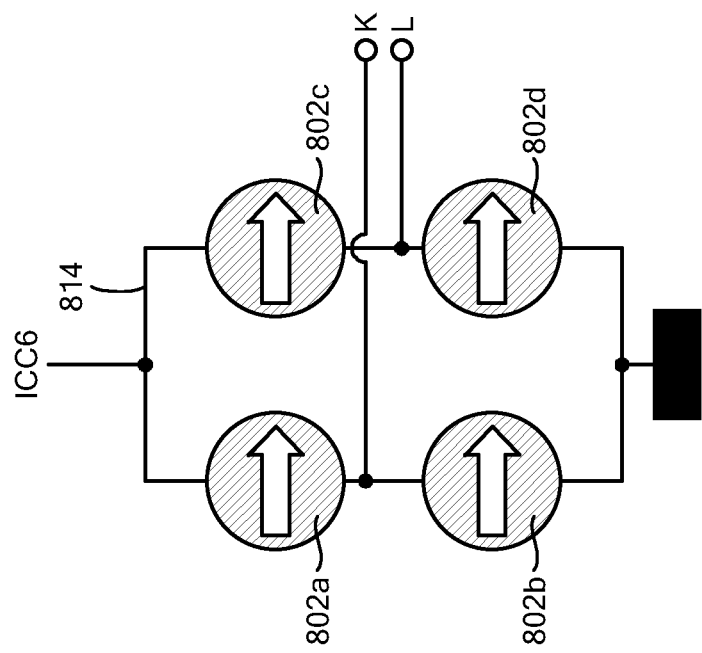
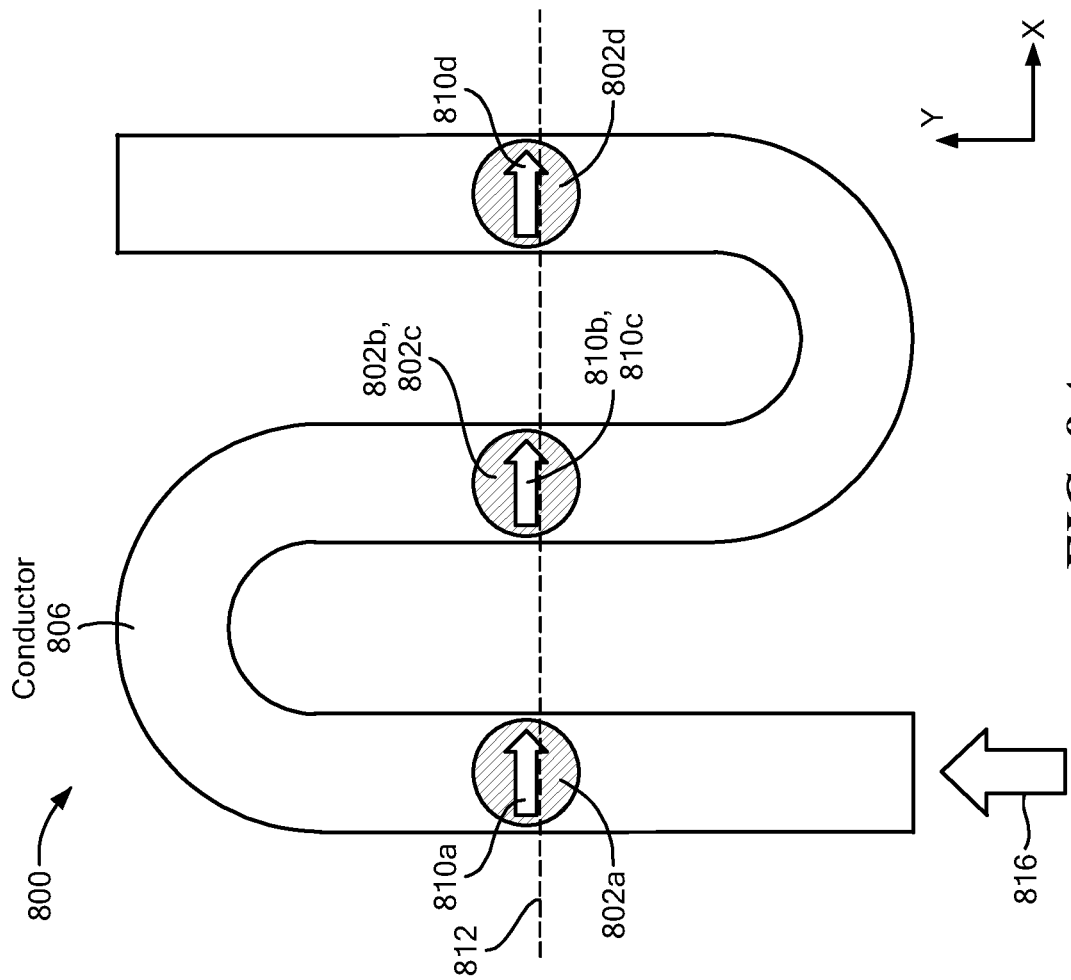
FIG. 8B
FIG. 8A

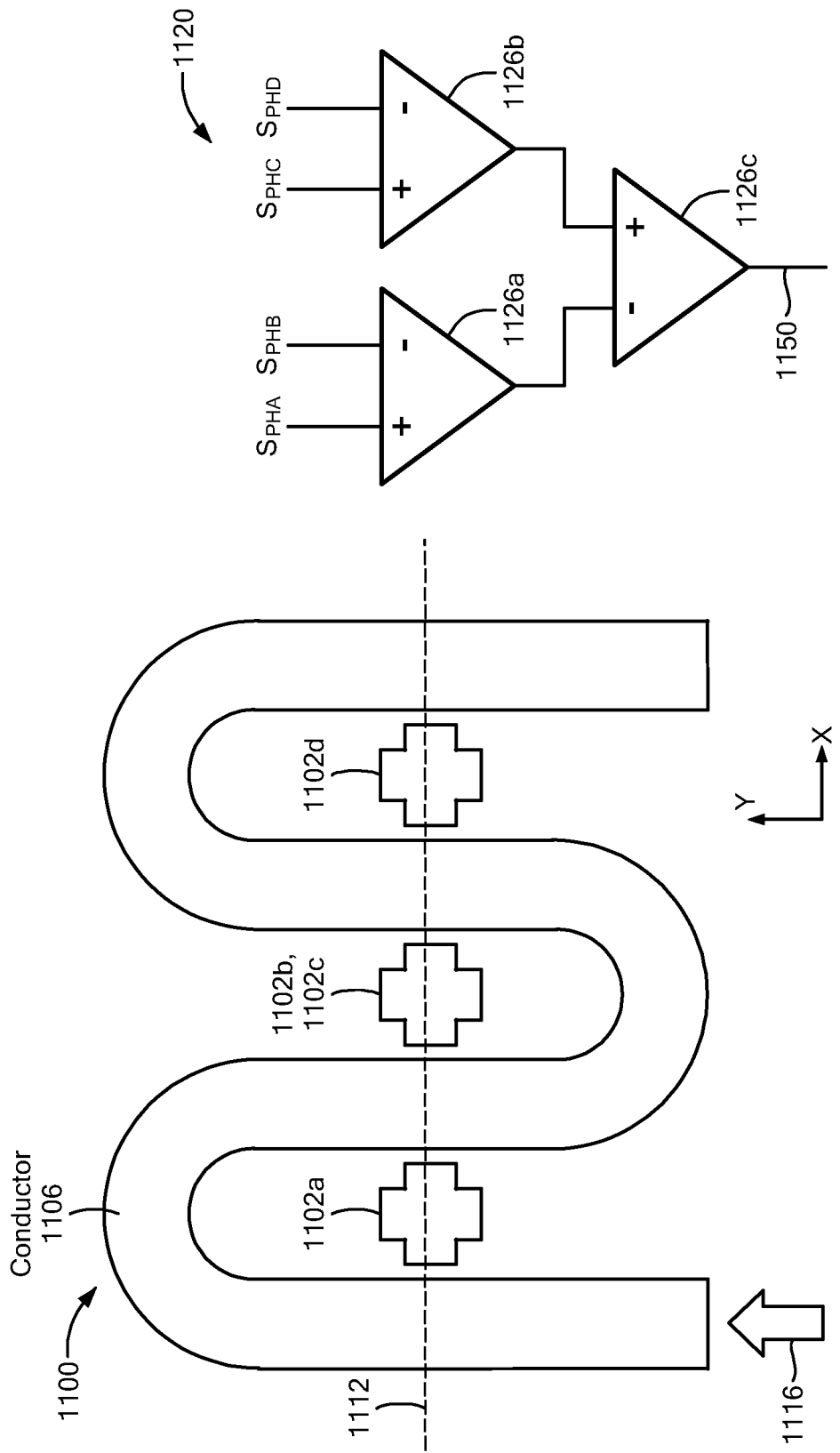

MAGNETIC FIELD CURRENT SENSOR TO REDUCE STRAY MAGNETIC FIELDS

BACKGROUND

Magnetic field sensors are used in a variety of applications, including, but not limited to, an angle sensor that senses an angle of a direction of a magnetic field; a current sensor that senses a magnetic field generated by a current carried by a current-carrying conductor; a magnetic switch that senses the proximity of a ferromagnetic object; a rotation detector that senses passing ferromagnetic articles, for example, magnetic domains of a ring magnet or a ferromagnetic target (e.g., gear teeth) where the magnetic field sensor is used in combination with a back-biased or other magnet; a magnetic field sensor that senses a magnetic field density of a magnetic field, a linear sensor that senses a position of a ferromagnetic target; and so forth.

A magnetic field sensor may include a magnetic field sensing element. The magnetic field sensing element is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. There are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

SUMMARY

In one aspect, a magnetic field current sensor includes an annihilation detector. The annihilation detector includes an annihilation bridge that includes magnetoresistance elements. The annihilation detector also includes a current bridge that includes at least two of the magnetoresistance elements, a first comparator configured to compare an output signal from the annihilation bridge and a second comparator configured to compare an output signal from the current bridge. An output of the annihilation detector indicates whether an annihilation exists in one or more of the magnetoresistance elements using at least one of the outputs signals of the first and second comparators.

The preceding aspect may include one or more of the following features. The annihilation detector may further include an OR circuit configured to receive an output signal from the first comparator and an output signal from the second comparator, and the OR circuit configured to provide the output signal of the annihilation detector indicating whether or not a current sensor is operating in a linear range. The magnetoresistance elements may include a first tunneling magnetoresistance (TMR) element, a second TMR element, a third TMR element, and a fourth TMR element. The first TMR element, the second TMR element, the third TMR element and the fourth TMR element may each include a free layer forming a magnetic disk. Each of the first TMR element, the second TMR element, the third TMR element and the fourth TMR element may have a reference direction in a first direction. The first TMR element may be part of a first leg of the annihilation bridge, the second TMR element may be part of a second leg of the annihilation bridge, the third TMR element may be part of the first leg of the annihilation bridge, and the fourth TMR element may be part of the second leg of the annihilation bridge. The first TMR element and second TMR element may be on top of a one-turn conductor. The third TMR element and the fourth TMR element may not be in contact with the one-turn conductor between the first TMR element and the second TMR element. A distance from the first TMR element to the second TMR element may be equal to a distance from the third TMR element to the fourth TMR element. The third TMR may be interleaved with the fourth element. The first TMR element, the second TMR element, the third TMR element and the fourth TMR element may be at least on the same plane. The first TMR element may be part of a first leg of the current bridge, the second TMR element may be part of a first leg of the current bridge, the first TMR element may be part of a second leg of the current bridge, and the second TMR element may be part of the second leg of the current bridge. The first TMR element, the second TMR element, the third TMR element and the fourth TMR element may be on top of a two-turn conductor. A distance from the first TMR element to the second TMR element may be equal to a distance from the third TMR element to the fourth TMR element. The second TMR may be interleaved with the third TMR element. The first TMR element, the second TMR element, the third TMR element and the fourth TMR element may be on the same plane. The first TMR element may be part of a first leg of the annihilation bridge, the second TMR element may be part of a first leg of the annihilation bridge, the third TMR element may be part of a second leg of the annihilation bridge, and the fourth TMR element may be part of the second leg of the annihilation bridge. The first TMR may be formed in a first pillar having a first diameter, the second TMR element may be formed in a second pillar having the first diameter, the third TMR element may be formed in a third pillar having a second diameter larger different from the first diameter, and the fourth TMR element may be formed in a fourth pillar having the second diameter. The first diameter may be smaller than the second diameter. The first TMR element, the second TMR element, the third TMR element and the fourth TMR element may be on top of a one-turn conductor. The first TMR element and the third TMR element are on top of one end of the conductor, and the second TMR element and the fourth TMR element are on top of the other end of the conductor. A distance between the first TMR element and the third TMR element may be about 20 microns, and a distance between the first TMR element and the second TMR element may be about 400 microns. A first bridge may include the first TMR element and the second TMR element forming a first leg of the first bridge with the first TMR element electrically closer in series to a first current source than the second TMR element, the first bridge may further include the first TMR element and the second TMR element forming a second leg of the first bridge with the second TMR element electrically closer in series to the first current source than the first TMR element, a second bridge may include the third TMR element and the fourth TMR element forming a first leg of the second bridge with the third TMR element electrically closer in series to a second current source than the fourth TMR element, the second bridge may further include the third TMR element and the fourth TMR element forming a second leg of the second bridge with the fourth TMR element electrically closer in series to the second current source than the third TMR element, and one of the first bridge or the second bridge is the annihilation bridge. The other one of the first bridge or the second bridge may be the current bridge. The first TMR element, the second TMR element, the third TMR element and the fourth TMR element may be on top of a one-turn conductor. The first TMR element and the fourth TMR element may be on top of one end of the conductor, and the second TMR element and the third TMR element may be on top of the other end of the conductor. The first TMR element and the third TMR element may be on a first axis, the second TMR element and the fourth TMR element are on a second axis, and the first axis is parallel to the second axis. A first bridge may include a first leg and a second leg; on the first leg, the first TMR element may be electrically closer in series to a first current source than the second TMR element, the second TMR element may be electrically closer in series to the first current source than the third TMR element, and the third TMR element may be electrically closer in series to the first current source than the fourth TMR element: on the second leg, the third TMR element may be electrically closer in series to the first current source than the fourth TMR element, the fourth TMR element may be electrically closer in series to the first current source than the first TMR element, and the first TMR element may electrically closer in series to the first current source than the second TMR element; and the first bridge may be one of the annihilation bridge or the current bridge.

In another aspect, a magnetic field current sensor includes a conductor and magnetic field sensing elements. The magnetic field sensing elements include a first magnetic field sensing element generating a first signal, a second magnetic field sensing element generating a second signal, a third magnetic field sensing element generating a third signal, and a fourth magnetic field sensing element generating a fourth signal. The magnetic field current sensor also includes circuitry that generates a signal indicative of twice the second signal less the first signal and less the fourth signal. The second magnetic field sensing element is on interleaved with the third magnetic field sensing element. The second signal and the third signal are substantially equal. The first magnetic field sensing element, the second magnetic field sensing element, the third magnetic field sensing element and the fourth magnetic field sensing element are in a first plane, and a distance between the first magnetic field sensing element and the second magnetic field sensing element is equal to a distance between the second magnetic field sensing element and the fourth magnetic field sensing element.

In a further aspect, a magnetic field current sensor includes an annihilation detector includes magnetoresistance elements each having a magnetic vortex. An output of the annihilation detector indicates whether an annihilation exists in one or more of the magnetoresistance elements. This aspect may include a feature where the annihilation detector may include an annihilation bridge that includes the magnetoresistance elements, and a current bridge that includes at least two of the magnetoresistance elements.

In a still further aspect, an annihilation detector includes magnetoresistance elements and an output of the annihilation detector indicates whether an annihilation exists in one or more of the magnetoresistance elements. This aspect may include a feature where the annihilation detector may include an annihilation bridge that includes the magnetoresistance elements, and a current bridge that includes at least two of the magnetoresistance elements.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 5A is a diagram of an example of current sensor configuration including a conductor and TMR elements having magnetic vortices;

FIG. 5B is an example of an annihilation bridge using the TMR elements in FIG. 5A;

FIG. 7A is an example of a current sensor configuration with a conductor and TMR elements having magnetic vortices;

FIG. 7B is an example of a current bridge using the TMR elements of FIG. 7A;

FIG. 8A is a diagram of another example of current sensor configuration including a conductor and TMR elements having magnetic vortices;

FIG. 8B is a diagram of a bridge using the TMR elements in FIG. 8A;

FIG. 11A is an example of a current sensor configuration including a conductor and planar Hall elements; and FIG. 11B is an example of a circuit to condition signals from the planar Hall elements of FIG. 11A.

DETAIL DESCRIPTION

Described herein are techniques to fabricate a current sensor that reduces the impact of stray magnetic fields. In one example, a current sensor includes an annihilation detector circuit and includes magnetoresistance elements that have a magnetic vortex in a free layer. In another example, a current sensor includes magnetoresistance elements that have at least two different pillar diameters and have a magnetic vortex in a free layer. In a further example, a current sensor includes magnetoresistance elements that have a magnetic vortex in a free layer and have some magnetoresistance elements that have reference directions that are 180° from other magnetoresistance elements. In a still further example, magnetic field sensing elements such as a planar Hall element, vertical Hall elements and magnetoresistance elements may be used in certain configurations in a current sensor to reduce gradient stray magnetic field effects and common mode stray magnetic field effects.

Figure 1A:
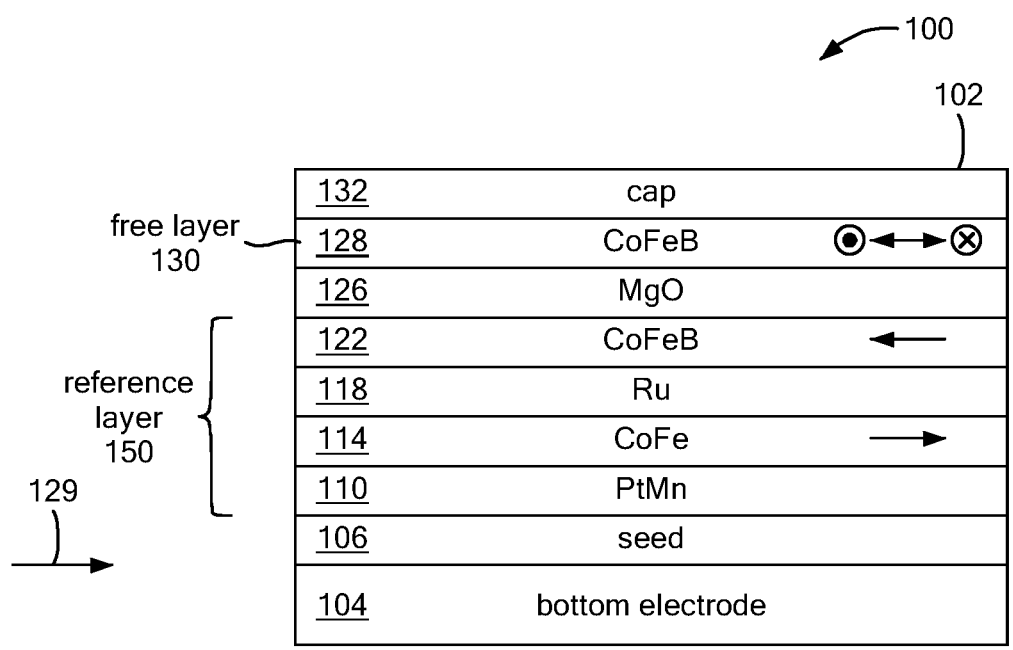
FIG. 1A is a block diagram of an example of a tunneling magnetoresistance (TMR) element.

Referring to FIG. 1A, an illustrative TMR element 100 can have a stack 102 of layers 106, 110, 114, 118, 122, 126, 128, 132 indicative of one pillar of a multi-pillar TMR element. Generally, the layer 106 is a seed layer (e.g., a copper nickel (CuN) layer) with the layer 110 located on the seed layer 106. The layer 110 includes platinum manganese (PtMn) or iridium manganese (IrMn), for example. The layer 114 is located on the layer 110 and the layer 118 is located on the layer 114. In one example, the layer 114 includes cobalt iron (CoFe) and the layer 118 is a spacer layer and includes ruthenium (Ru). On the layer 118, a magnesium oxide (MgO) layer 126 is sandwiched between two cobalt iron boron (CoFeB) layers 122, 128. A cap layer 132 (e.g., tantalum (Ta)) is located on the CoFeB layer 128. The layer 114 is a single layer pinned layer that is magnetically coupled to the layer 110. The physical mechanism that is coupling layers 110 and 114 together is sometimes called an exchange bias.

A free layer 130 includes the CoFeB layer 128. In some examples, the free layer 130 may include an additional layer of nickel iron (NiFe) (not shown) and a thin layer of tantalum (not shown) between the CoFeB layer 128 and the NiFe layer.

Figure 1B:
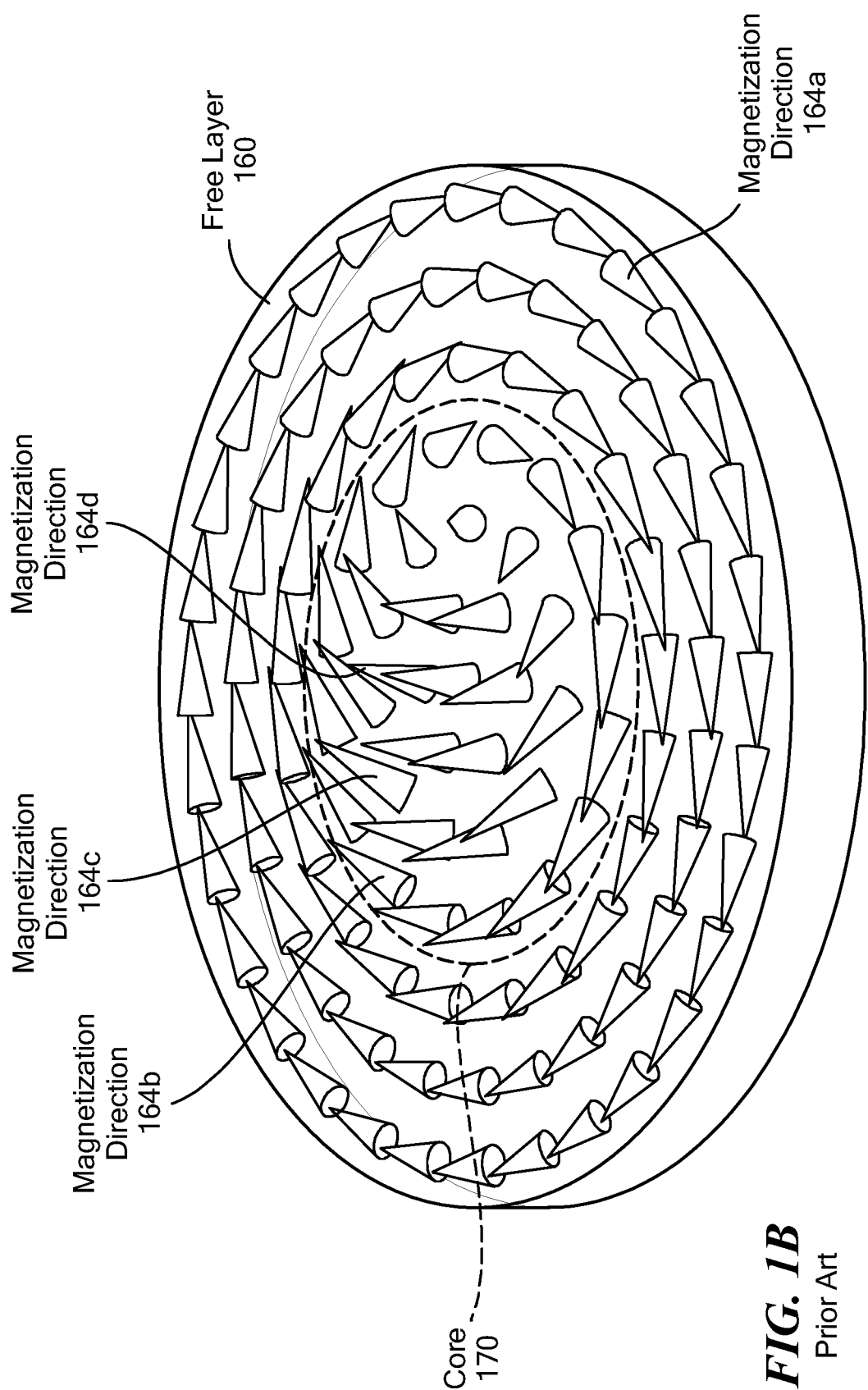
FIG. 1B is a diagram of an example of a free layer having a magnetic vortex that includes a core in the center of the free layer.

Referring to FIG. 1B, a TMR formed as a pillar may include a free layer 160 that has a magnetic vortex. For example, the magnetic vortex has magnetization directions (e.g., a magnetization direction 164a, magnetization direction 164b, magnetization direction 164c, magnetization direction 164d) that loop around the free layer 160. The free layer 160 is a magnetic disk. An angle of the magnetization direction 164a with respect to a surface of the free layer 160 being about 0° at the outer edges of the free layer 160.

The magnetic vortex has a core 170 (sometimes called a "magnetic vortex core"). Closer to the center of the core 170, the magnetization directions start to become more and more non-planar the closer to the center of the core 170. That is, the angle of the magnetization direction with respect to the surface of the free layer 160 increases the closer to the center of the core 170 a magnetization direction is. For example, an angle of the magnetization direction 164b with respect to the surface of the free layer 160 is higher than the angle of the magnetization direction 164a with respect to the surface of the free layer 160, an angle of the magnetization direction 164c with respect to the surface of the free layer 160 is higher than the angle of the magnetization direction 164b with respect to the surface of the free layer 160, and an angle of the magnetization direction 164d with respect to the surface of the free layer 160 is higher than the angle of the magnetization direction 164c with respect to the surface of the free layer 160.

Exchange energy and demagnetizing energy are two key phenomena in magnetic disks. Exchange energy increases energy cost when the magnetization is not homogeneous across the magnetic material of the magnetic disk while the demagnetizing energy increases cost when the magnetization directions point outside of the magnetic disk. Exchange energy is a volume effect term while demagnetizing energy is an edge effect term.

Figure 1C:
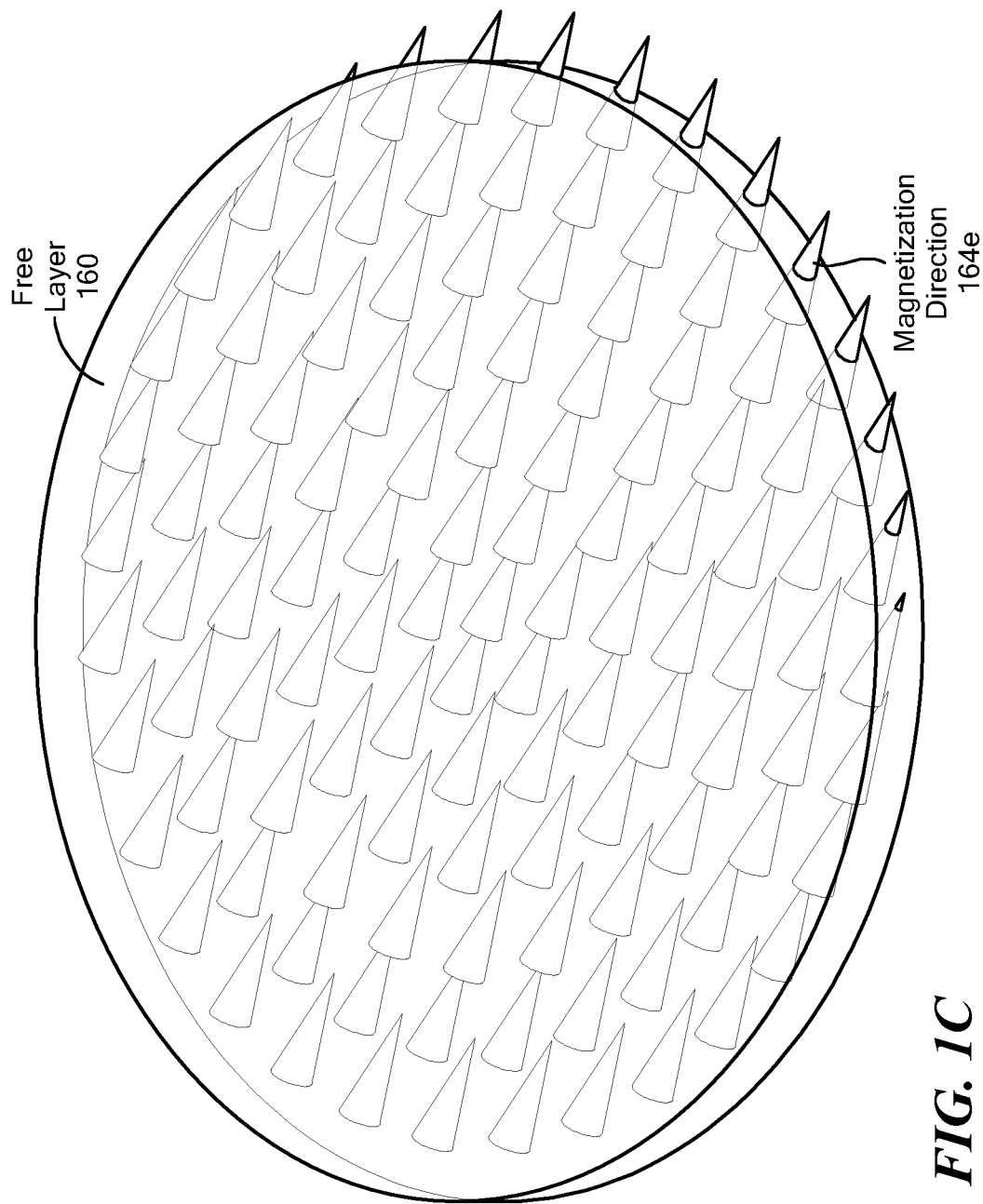
FIG. 1C is a diagram of an example of a free layer having homogenous magnetization directions.

Referring to FIG. 1C, when the magnetic disk of the free layer 160 has a large diameter and is thin, magnetization directions (e.g., a magnetization direction 164e) tend to be uniform and in the plane of the free layer 160 across the magnetic disk. There is a cost of demagnetizing energy as magnetization directions point outside the magnetic disk. This energy cost is located on the edges of the magnetic disk. Thus, if the magnetic disk has a large enough diameter, then the volume effect (i.e., exchange energy) is more important than an edge effect (i.e., demagnetizing energy). Therefore, it is less expensive to have the magnetization homogeneous in a plane.

Referring back to FIG. 1B, if the magnetic disk is not as wide in diameter and thicker than the magnetic disk in FIG. 1C, then the edge effect (i.e., demagnetizing energy) is more important than the volume effect (i.e., exchange energy), which enables the magnetization directions to curl inside the magnetic disk. Exchange energy prevents the singularity in the center, so that the magnetization directions point up or downward in the core 170 (e.g., magnetization directions 164c, 164d). The core 170 produces demagnetizing energy, but the demagnetizing energy is produced in a very limited area of the magnetic disk. In FIG. 1B, the size of the core 170 is exaggerated with respect to the free layer 160 to make it easier to be viewed and described herein.

Figure 1D:
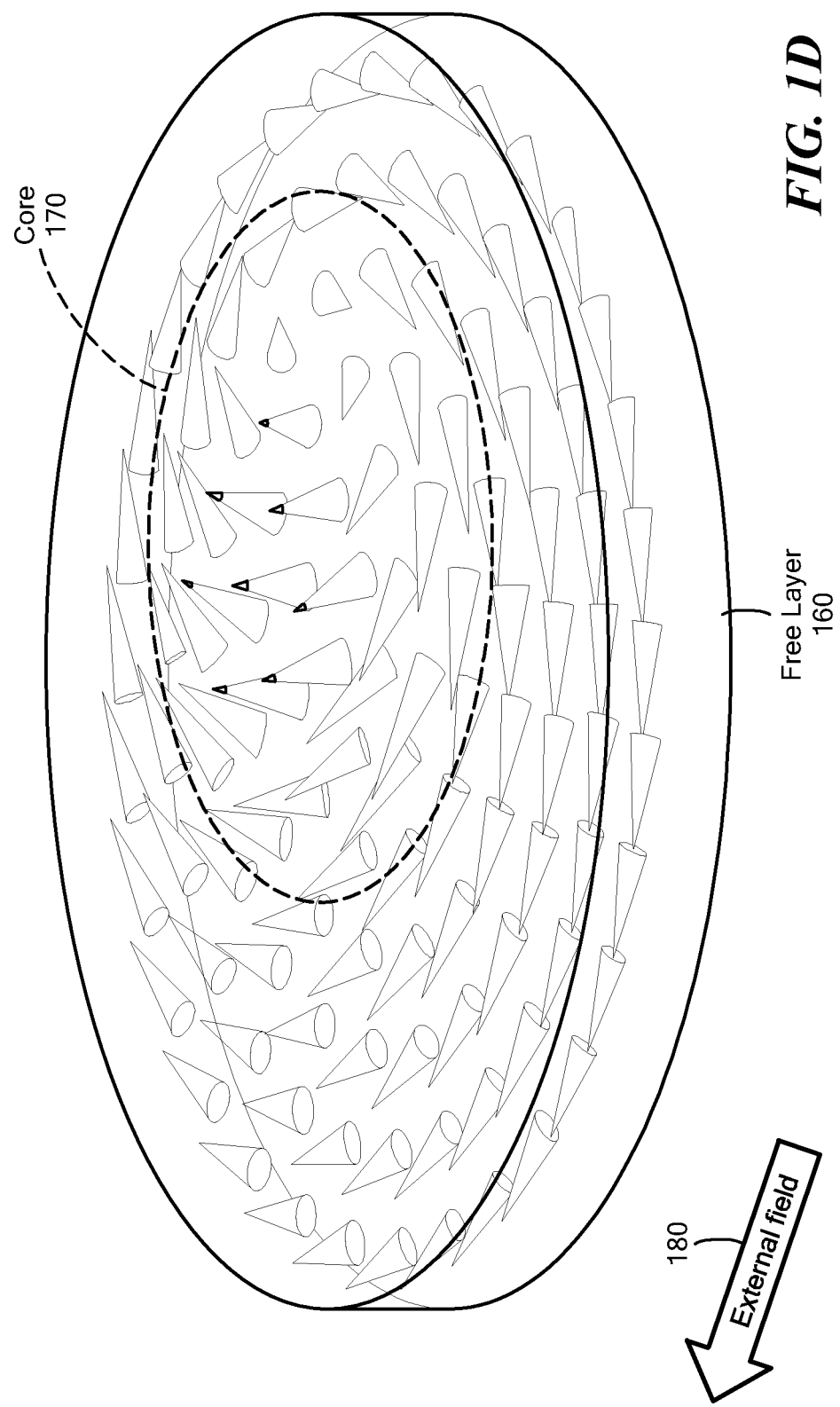
FIG. 1D is diagram of an example of a free layer influenced by an external magnetic field causing a magnetic vortex to be away from the center of a free layer.
Figure 1E:
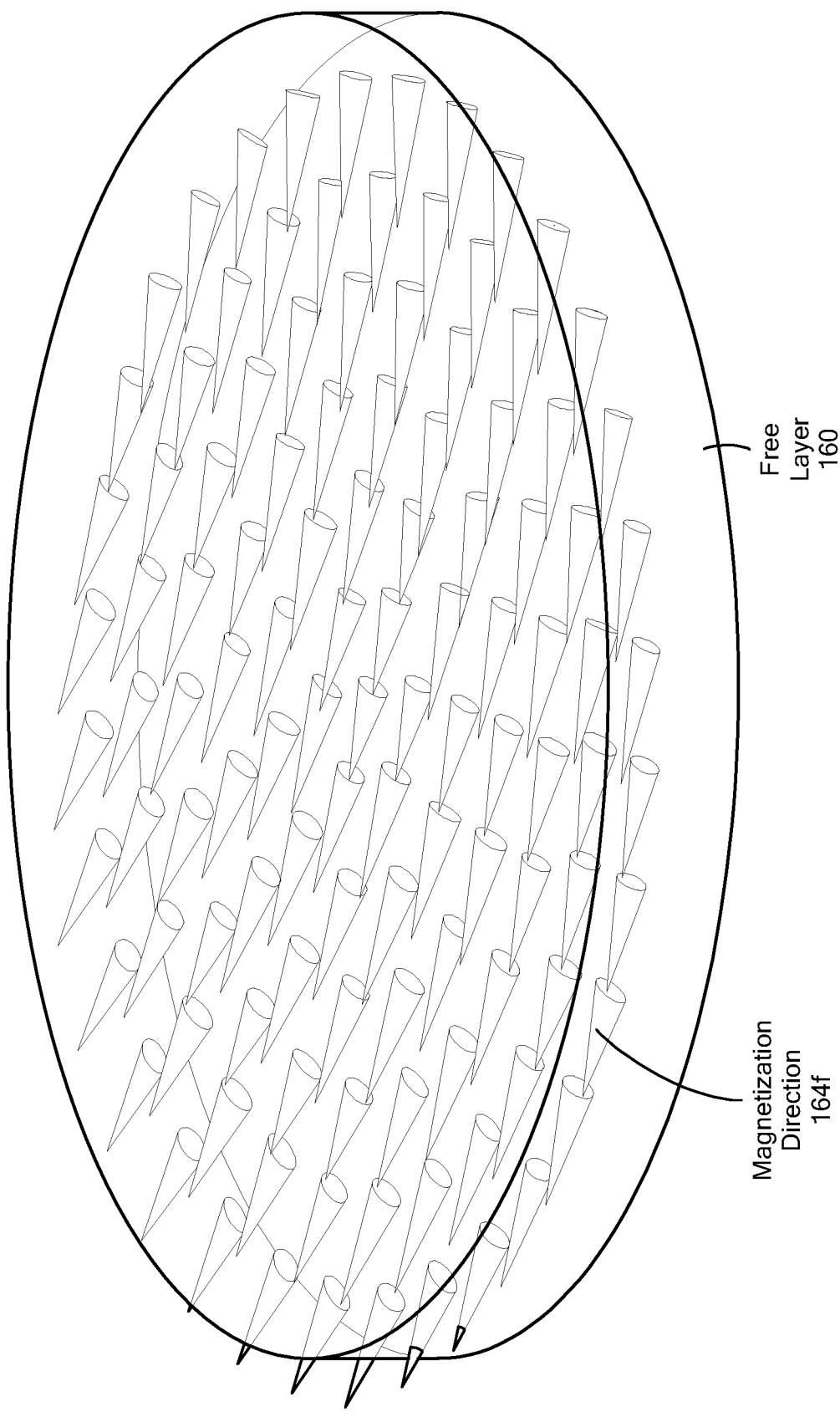
FIG. 1E is diagram of an example of a free layer influenced by an external magnetic field to have almost homogenous magnetization directions.

Referring to FIGS. 1D and 1E, when an external magnetic field 180 is applied to the free layer 160 that includes a magnetic vortex, the core 170 of the magnetic vortex moves to favor magnetization along the applied magnetic field 180. However, if the applied magnetic field 180 is too large, the core 170 is pushed out of the magnetic disk and the magnetization directions (e.g., magnetization direction 164e) in the magnetic disk becomes almost homogeneous. This is called vortex annihilation. The external magnetic field 180 must be decreased down to a nucleation magnetic field level before a vortex core can be nucleated inside the magnetic disk again as will be described with respect to FIG. 2.

Figure 1F:
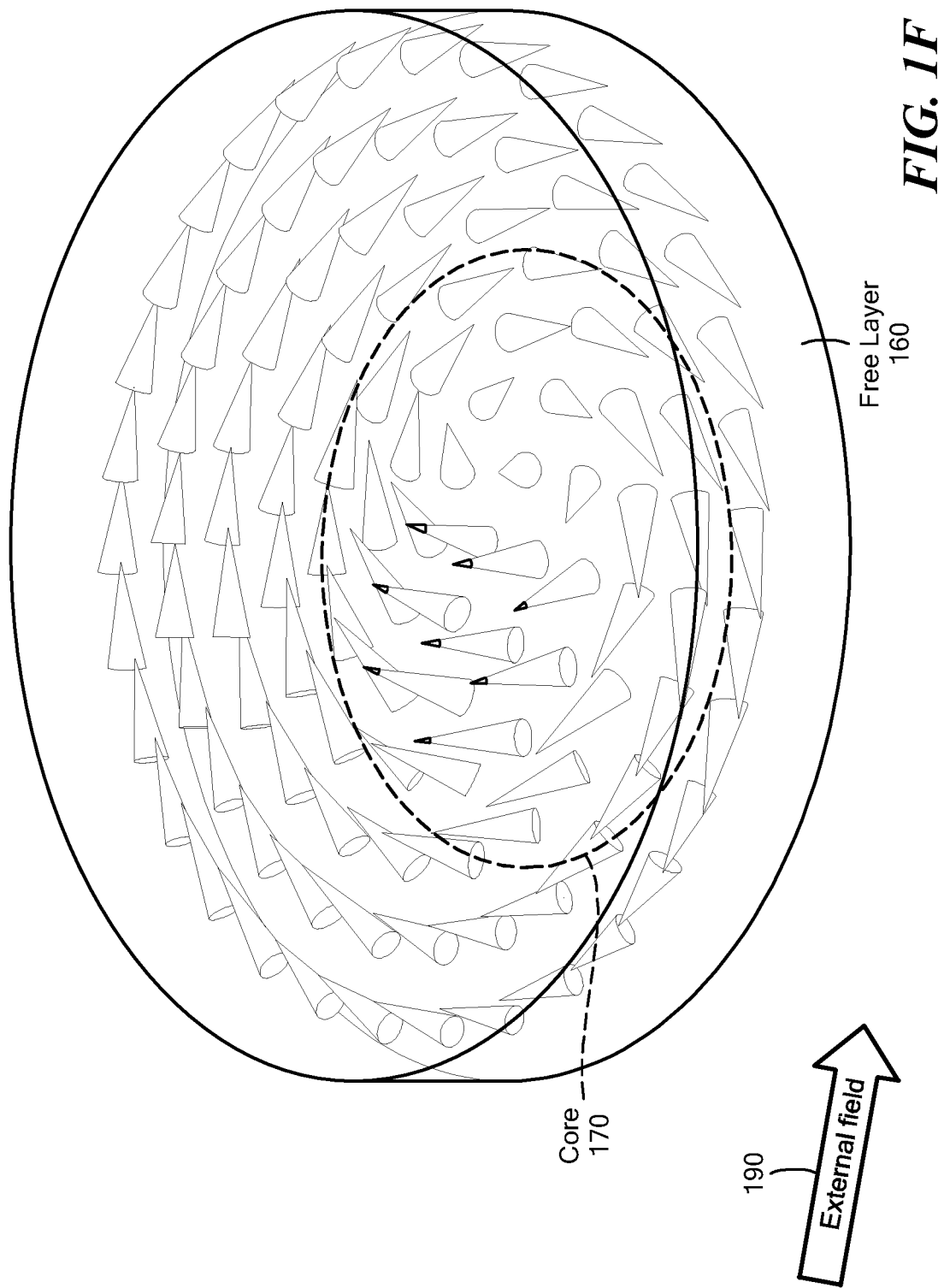
FIG. 1F is diagram of another example of a free layer being influenced by an external magnetic field causing a magnetic vortex to be away from the center of a free layer.
Figure 1G:
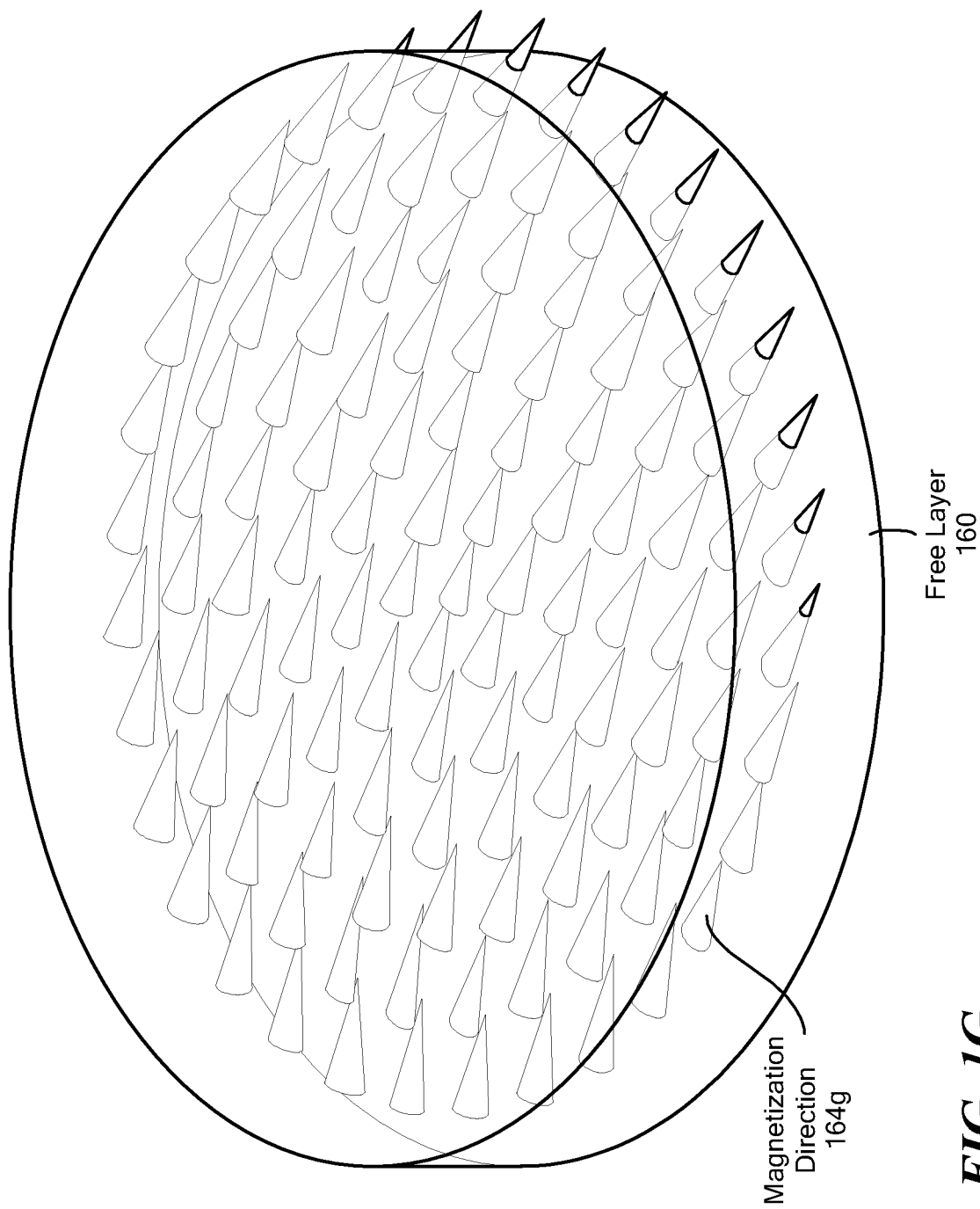
FIG. 1G is diagram of another example free layer being influenced by an external magnetic field to have almost homogenous magnetization directions.

Referring to FIGS. 1F and 1G, similarly, when an external magnetic field 190 is applied (opposite to the magnetic field 180) to the free layer 160 that includes a magnetic vortex, the core 170 of the magnetic vortex moves to favor magnetization along the applied magnetic field 190. However, if the applied magnetic field 180 is too large, the core 170 is pushed out of the magnetic disk and the magnetization directions (e.g., magnetization direction 164d in the magnetic disk becomes homogeneous.

Figure 2:
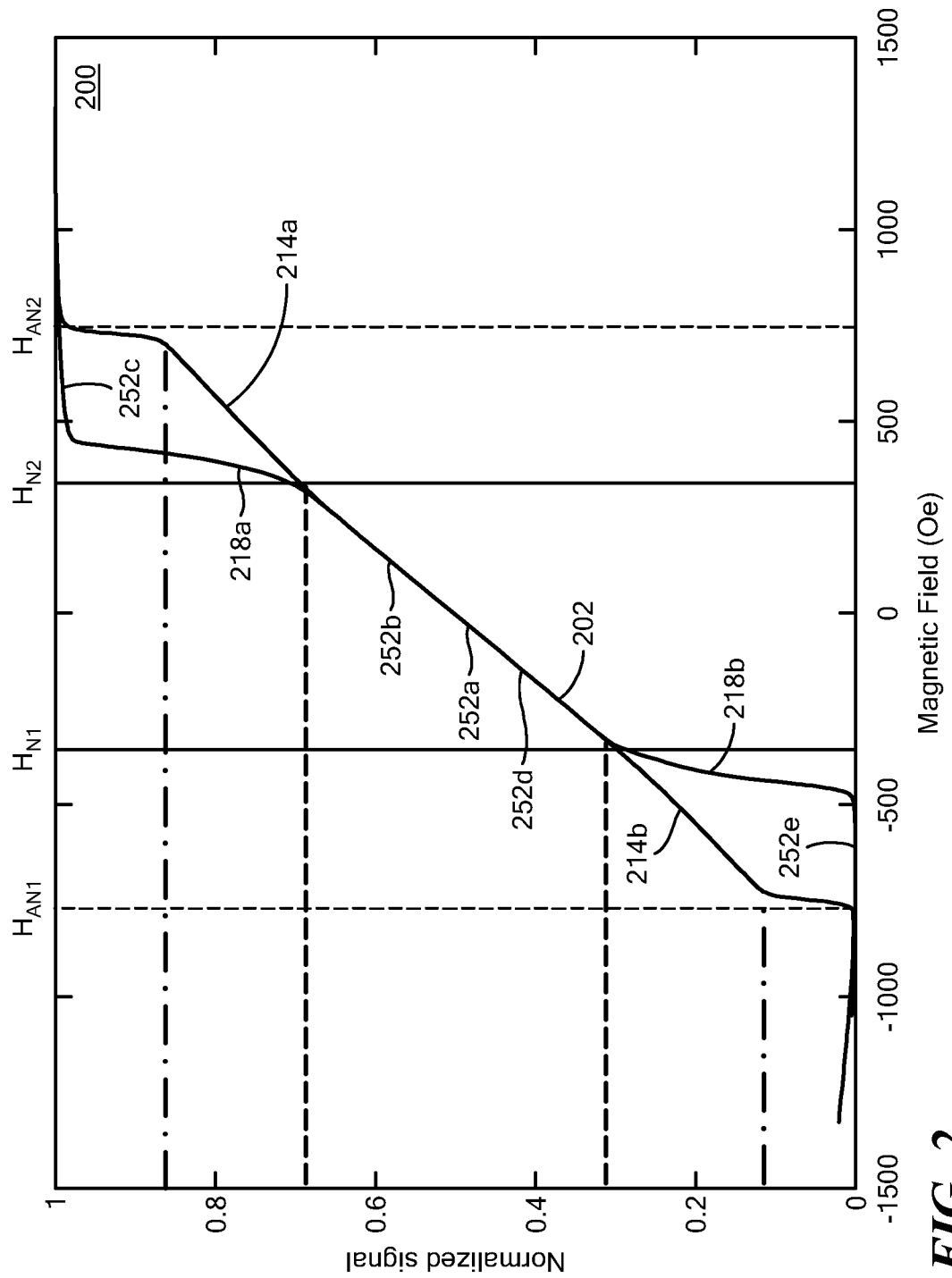
FIG. 2 is graph of a response signal versus magnetic field for a tunneling magnetoresistance element (TMR) having the magnetic vortex in the free layer.

Referring to FIG. 2, a graph 200 depicts an example of a TMR signal response to changes in a detected magnetic field. Nucleation fields are denoted by $H_{N1}$ and $H_{N2}$. Annihilation fields are denoted by $H_{AN1}$ and $H_{AN2}$. A TMR signal response 202 is linear between $H_{N1}$ and $H_{N2}$.

However, between $H_{AN1}$ and $H_{N1}$ and between $H_{N2}$ and $H_{AN2}$, the TMR signal response 202 may be either linear or saturated. For example, the TMR signal response 202 between $H_{N2}$ and $H_{AN2}$ is linear along a portion 214a and saturated along the portion 218a, and the TMR signal response 202 between $H_{N1}$ and $H_{AN1}$ is linear along a portion 214b and saturated along the portion 218b.

Saturation occurs when a magnetic vortex of TMR is exposed to a magnetic field that is higher than $H_{AN1}$ or $H_{AN2}$ (i.e., the vortex is annihilated) and the TMR signal response 202 does not return to $H_{N1}$ or $H_{N2}$, respectively. An annihilation detector as described herein (e.g., an annihilation detector 300 (FIG. 3)) can determine if an annihilated vortex exists in which case the TMR signal response 202 beyond $H_{N1}$ and $H_{N2}$ cannot be used. However, if the annihilation detector does not detect an annihilated vortex, then the TMR signal response 202 between $H_{AN1}$ and $H_{N1}$ and between $H_{N2}$ and $H_{AN2}$ may be used.

A point 252a on the TMR signal 202 response corresponds to the free layer 160 in FIG. 1B. A point 252b on the TMR signal 202 response corresponds to the free layer 160 in FIG. 1D, and a point 252c on the TMR signal 202 response corresponds to the free layer 160 in FIG. 1E. A point 252d on the TMR signal 202 response corresponds to the free layer 160 in FIG. 1F, and a point 252e on the TMR signal 202 response corresponds to the free layer 160 in FIG. 1G.

Figure 3:
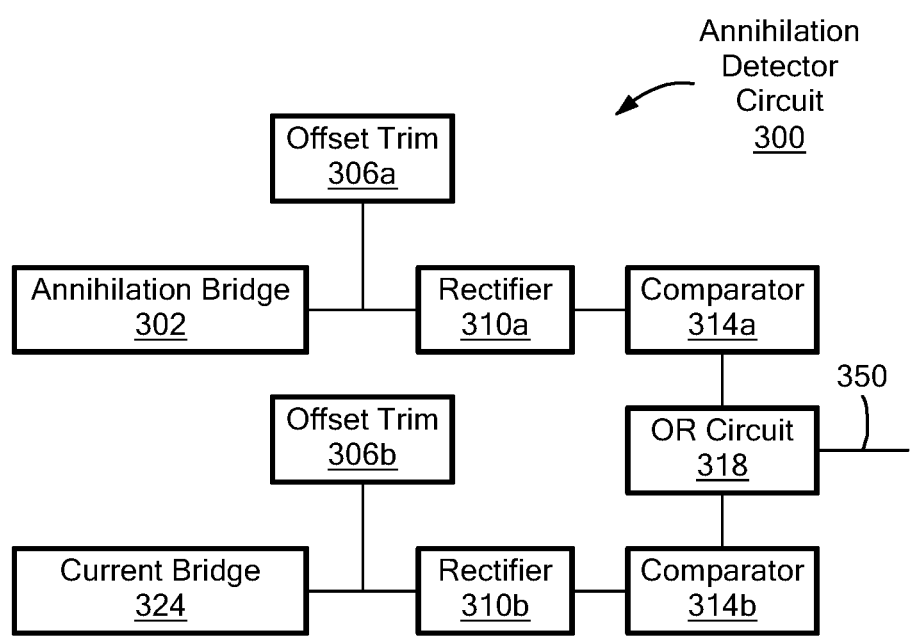
FIG. 3 is a block diagram of an example of an annihilation detector circuit.

Referring to FIG. 3, an example of an annihilation detector that can detect an annihilation vortex is the annihilation detector 300. The annihilation detector 300 includes an annihilation bridge 302, offset trim circuits 306a, 306b, rectifiers 310a, 310b, comparators 314a, 314b, an OR circuit, and a current bridge 324.

An output of the annihilation bridge 302 is trimmed by the offset trim circuit 306a and then rectified by the rectifier 310a. The comparator 314a compares the rectified signal from the rectifier 310a with a first threshold value. In one example, if the rectified signal from the rectifier 310a is higher than the first threshold, then the vortex is annihilated. In one example, the first threshold is derived from a hysteresis curve.

An output of the current bridge 324 is trimmed by the offset trim circuit 306b and then rectified by the rectifier 310b. The comparator 314b compares the rectified signal from the rectifier 310b with a second threshold value. In one example, if the rectified signal from the rectifier 310b is higher than the second threshold, then the vortex is annihilated. In one example, the second threshold may be the current that corresponds to $H_{AN1}$ and/or $H_{AN2}$.

The outputs of the comparator 314a, 314b are sent to the OR circuit 318. The OR circuit performs a logical "OR" function on the outputs of the comparator 314a, 314b to generate an output signal 350, which is an output for the annihilation detector 300.

Figure 4B:
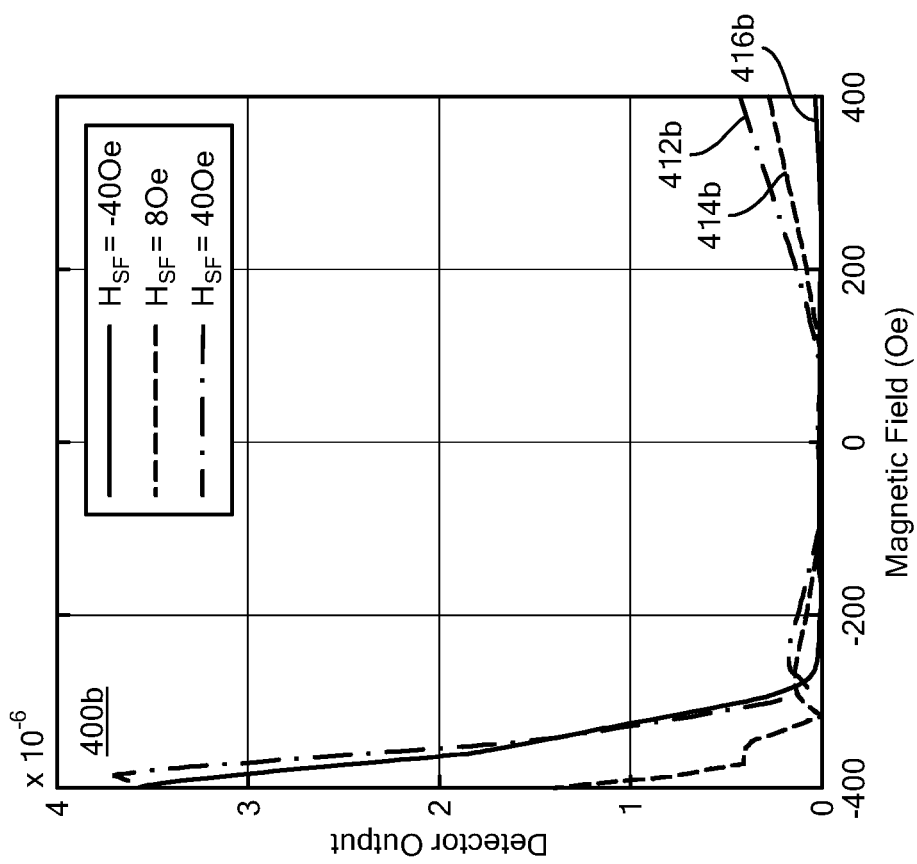
FIGS. 4A and 4B are graphs depicting examples of outputs of the annihilation detector.
Figure 4A:
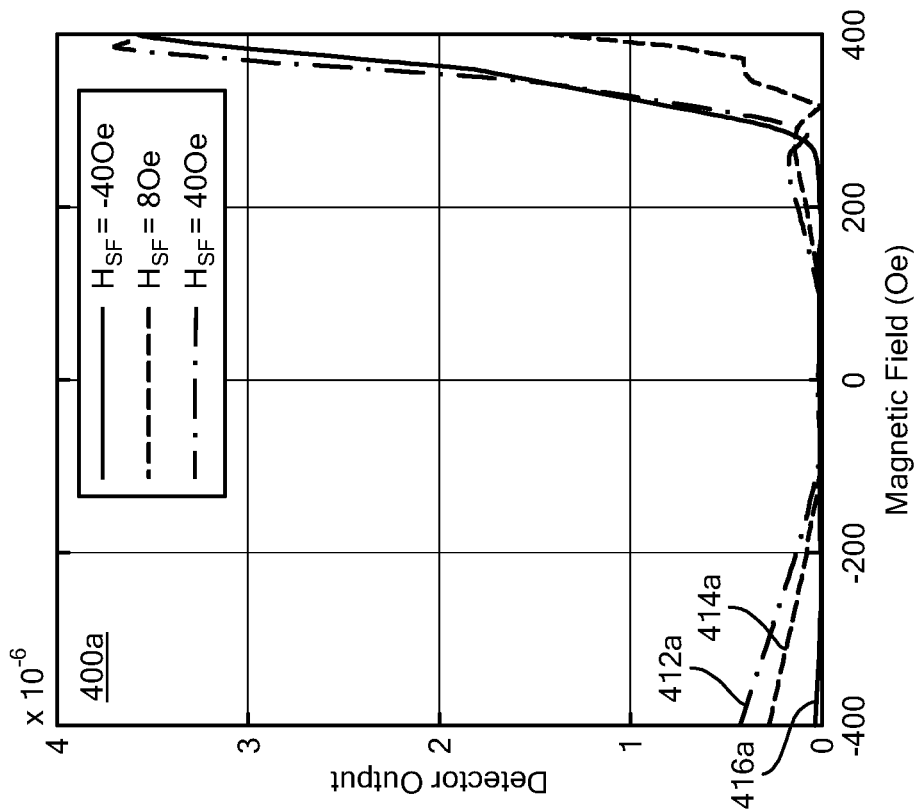

Referring to FIGS. 4A and 4B, graphs 400a, 400b are examples of the output signal 350 (FIG. 3) for different stray magnetic fields $H_{SF}$. The X-axis, for each graph 400a, 400b, is a magnetic field (i.e., signal of interest) generated from the conductor (e.g., the conductor 506), and the Y-axis, for each graph 400a, 400b, is the rectified output (in arbitrary units) of the annihilation detector 300. There are two graphs 400a, 400b because the annihilation of the vortex may happen either toward negative magnetic fields (graph 400b) or positive magnetic fields (400a). Curves 412a, 412b represent a stray magnetic field of 40 Oersted, curves 414a, 414b represent a stray magnetic field of 8 Oersted and Curves 412a, 412b represent a stray magnetic field of 40 Oersted.

Referring to FIG. 5A, a current sensor configuration 500 includes TMR elements (e.g., a TMR element 502a, a TMR element 502b, a TMR element 502c and a TMR element 502d) and a one-turn conductor 506. The TMR elements 502a, 502b, 502c, 502d each includes at least one free layer with a magnetic vortex.

TMR elements 502a, 502b, 502c, 502d each include a reference direction that is the same direction as the other TMR elements. A reference direction is the direction that the magnetoresistance element is most sensitive to changes in a magnetic field. For example, a resistance of the magnetoresistance element changes the most for changes in the magnetic field in the reference direction. The TMR element 502a has a reference direction 510a, the TMR element 502b has a reference direction 510b, the TMR element 502c has a reference direction 510c, and the TMR element 502d has a reference direction 510d.

The TMR elements 502a, 502b are on top of the conductor 506 and the TMR elements 502c, 502d are disposed between the TMR elements 502a, 502b and not in contact with the conductor 506. In one example, TMR element 502c and the TMR element 502d may be interleaved. In one example, the TMR elements 502a, 502b may be separated from the conductor 506 by a distance between 50 and 200 microns.

The TMR elements 502a, 502b, 502c, 502d are on a plane 512 that extends into and out of FIG. 5A. During operation, a current 516 is applied to one end of the conductor 506 to form an Oersted field.

Since the TMR elements 502c, 502d are placed in the center of the one-turn conductor 506, TMR elements 502c, 502d are exposed only to a stray magnetic field $H_{SF}$, while the TMR elements 502a, 502b are exposed to both a stray magnetic field, Hs F and the Oersted field caused by the current I (e.g., current 516) through the conductor 506. In one example, the TMR element 502a detects a magnetic field $H_A$, the TMR element 502b detects a magnetic field $H_B$, the TMR element 502c detects a magnetic field $H_C$, and the TMR element 502d detects a magnetic field H D so that:

$H_A = H_{SF} + \alpha \cdot I$, $H_B = H_{SF} - \alpha \cdot I$, $H_C = H_D = H_{SF}$, where α is a conversion factor from current to magnetic field.

Referring to FIG. 5B, an example of an annihilation bridge 302 is an annihilation bridge 302'. An output of the bridge 302' is the difference between a signal measured at node A and a signal measured at node B.

In one example, with a current source ICC1, the signal measured at node A and the signal measured at node B are each voltage signals. In another example, if the current source ICC1 is replaced with a fixed voltage source and the voltages are fixed at node A and node B, then the signal measured at node A and the signal measured at node B are each current signals.

The TMR element 502a and the TMR element 502c are electrically connected in series to form a first leg of the bridge 302'. The TMR element 502a is electrically closer to the current source ICC1 than the TMR element 502c.

The TMR element 502b and the TMR element 502d are electrically connected in series to form a second leg of the bridge 302'. The TMR element 502d is electrically closer to the current source ICC1 than the TMR element 502b.

By connecting the TMR elements 502a, 502b, 502c, 502d in a bridge one can obtain a net magnetic field due to stray field and the Oersted field of:

$$H_C+H_D-(H_A+H_B)=H_{SF}+H_{SF}-(H_{SF}+\alpha \cdot I+H_{SF}-\alpha \cdot I)=0.$$

The signal is zero whatever the current or stray magnetic field are unless a vortex is annihilated because the magnetic field on one element is higher than $H_{AN}$. Thus, the configuration in FIG. 5A reduces stray field signals unless one or more of the TMR elements 502a, 502b, 502c, 502d no longer has a linear response to a magnetic field (i.e., have one or more annihilated vortices).

Figure 5C:
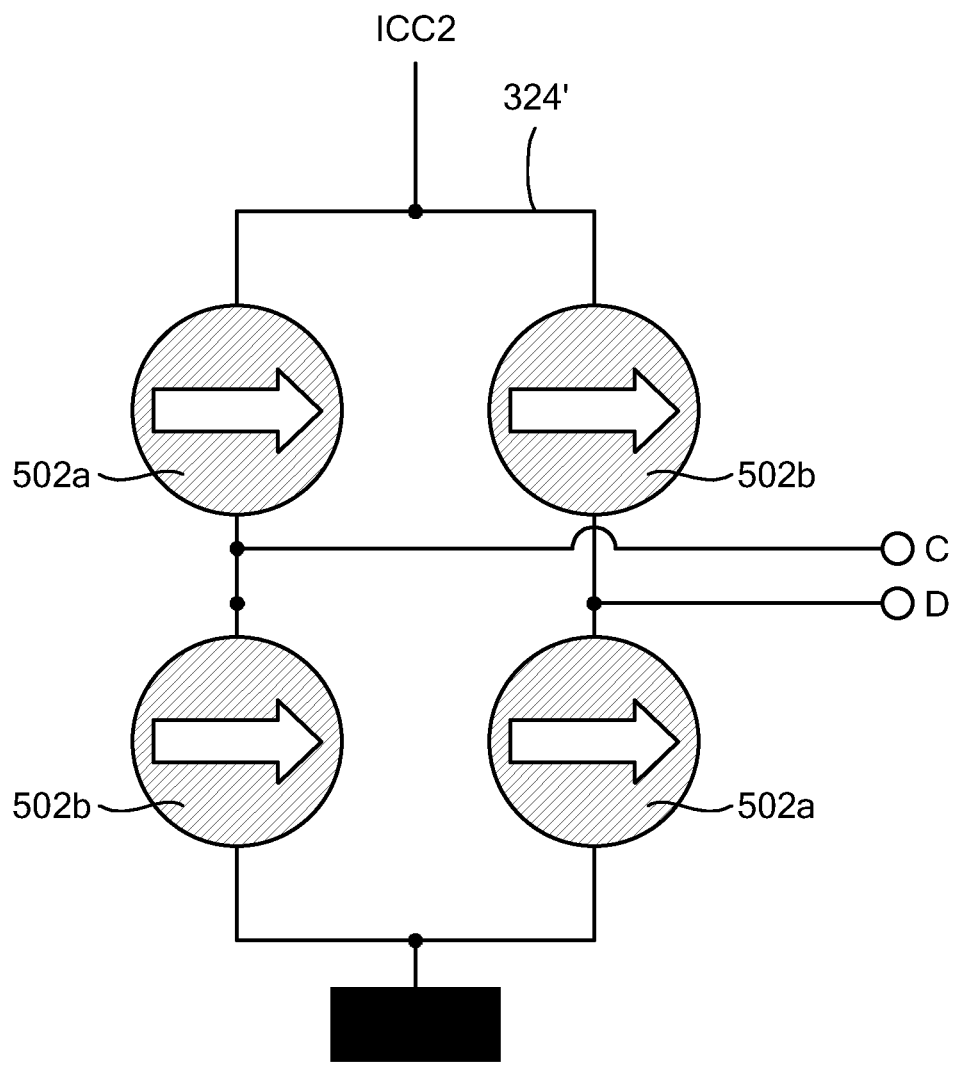
FIG. 5C is an example of a current bridge using the TMR elements in FIG. 5A.

Referring to FIG. 5C, an example of a current bridge 324 is a current bridge 324'. An output of the bridge 324' is the difference between a signal measured at node C and a signal measured at node D.

In one example, with a current source ICC2, the signal measured at node C and the signal measured at node D are each voltage signals. In another example, if the current source ICC2 is replaced with a fixed voltage source and the voltages are fixed at node C and node D, then the signal measured at node C and the signal measured at node D are each current signals.

The TMR element 502a and the TMR element 502b are electrically connected in series to form a first leg of the bridge 324'. The TMR element 502a is electrically closer in series to the current source ICC2 than the TMR element 502b.

The TMR element 502b and the TMR element 502a are electrically connected in series to form a second leg of the bridge 324'. The TMR element 502b is electrically closer in series to the current source ICC2 than the TMR element 502b.

Figure 6B:
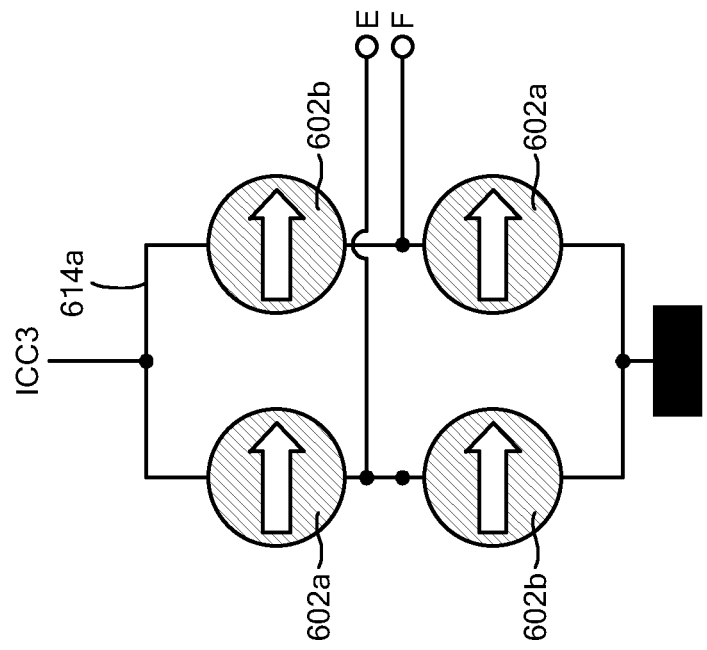
FIG. 6B is a diagram of an example of a bridge for TMR elements in FIG. 6A having a smaller diameter pillar.
Figure 6A:
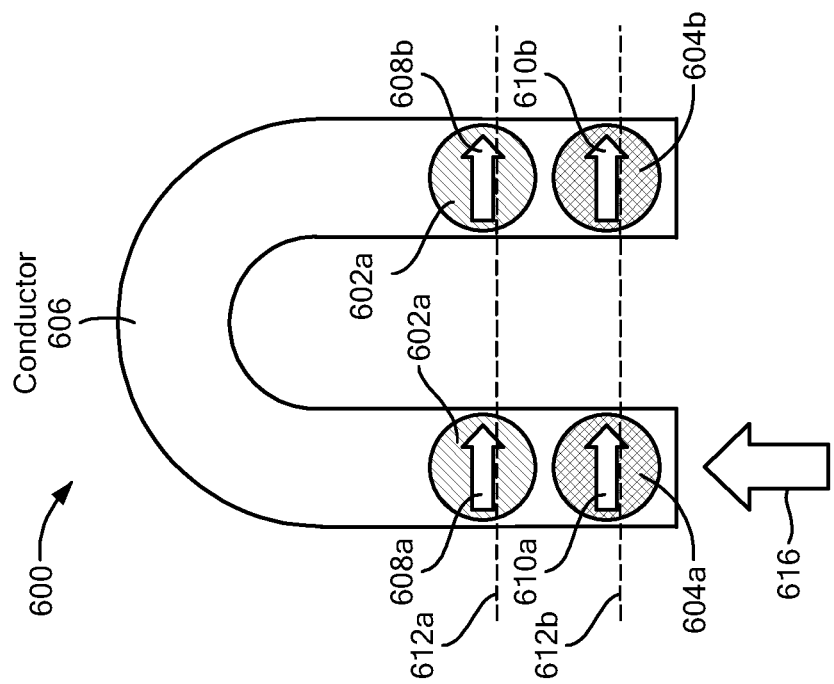
FIG. 6A is a diagram of an example of current sensor configuration including a conductor and TMR elements having two different pillar diameters and having magnetic vortices.
Figure 6C:
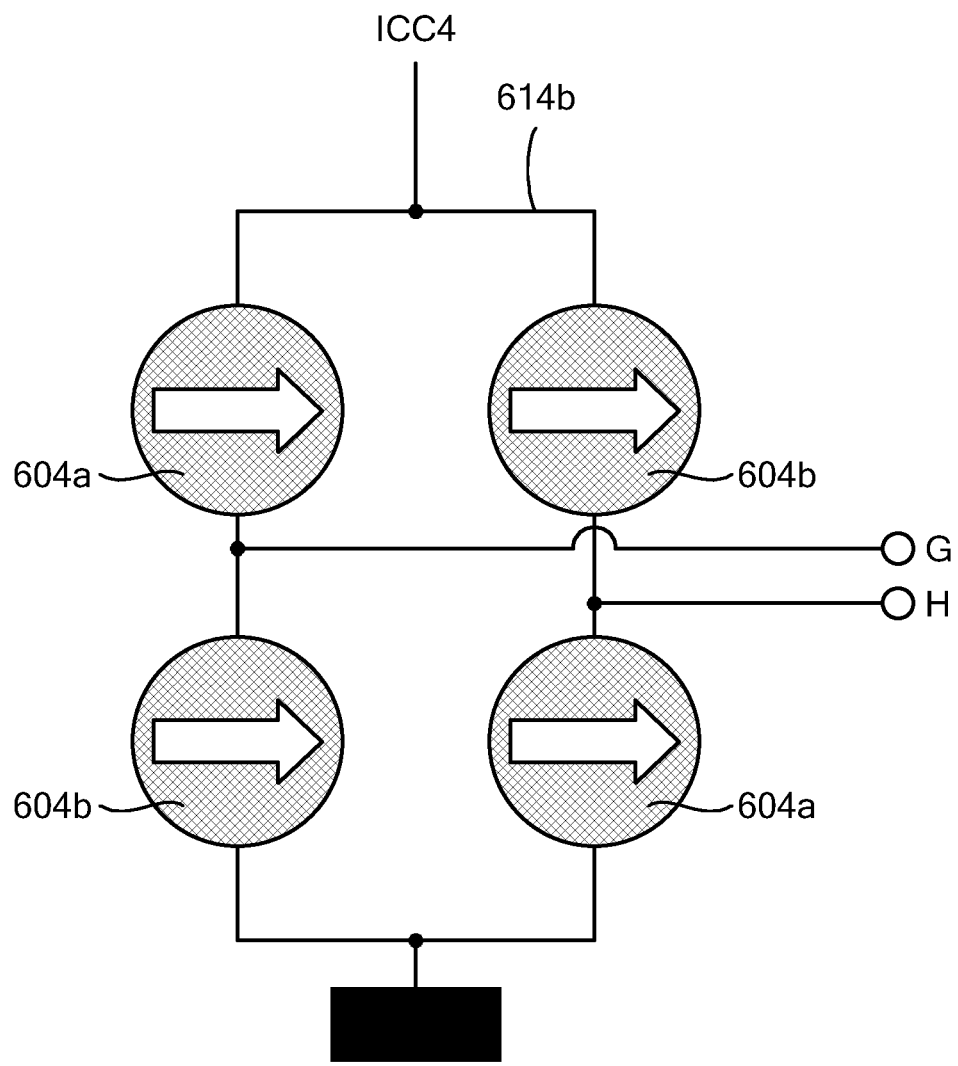
FIG. 6C is a diagram of an example of a bridge for TMR elements in FIG. 6A having a larger diameter pillar.

Referring to FIG. 6A, a current sensor configuration 600 includes TMR elements (e.g., a TMR element 602a, a TMR element 602b, a TMR element 604a and a TMR element 604b) and a one-turn conductor 606. The TMR elements 602a, 602b, 604a, 604b each includes a free layer with a magnetic vortex.

The TMR elements 602a, 602b are formed having pillars that have diameters that are smaller than pillars of TMR elements 604a, 604b. In one example, the TMR elements 602a, 602b are formed in pillars that have diameters of 2 microns, and the TMR elements 604a, 604b are formed in pillars that have diameters of 3 microns.

TMR elements 602a, 602b, 604a, 604b each include a reference direction that is the same direction as the other TMR elements. For example, the TMR element 602a has a reference direction 608a, the TMR element 602b has a reference direction 608b, the TMR element 604a has a reference direction 610a, and the TMR element 604b has a reference direction 610b.

The TMR elements 602a, 604a are on top of one end of the conductor 606 and the TMR elements disposed 602b, 604b are on top of the other end of the conductor 606. In one example, the TMR elements 602a, 602b, 604a, 604b may be separated from the conductor 606 by a distance between 50 and 200 microns.

The TMR elements 602a, 602b are on an axis 612a, and the TMR elements 604a, 604b are on an axis 612b. In one example, axis 612a is parallel to axis 612b. During operation, a current 616 is applied to one end of the conductor 606.

Referring to 6B, a bridge 614a includes TMR elements 602a, 602b. An output of the bridge 614a is the difference between a signal measured at node E and a signal measured at node F.

In one example, with a current source ICC3, the signal measured at node E and the signal measured at node F are each voltage signals. In another example, if the current source ICC3 is replaced with a fixed voltage source and the voltages are fixed at node E and node F, then the signal measured at node E and the signal measured at node F are each current signals.

The TMR element 602a and the TMR element 602b are electrically connected in series to form a first leg of the bridge 614a. The TMR element 602a is electrically closer in series to the current source ICC3 than the TMR element 602b.

The TMR element 602b and the TMR element 602a are electrically connected in series to form a second leg of the bridge 614a. The TMR element 602b is electrically closer in series to the current source ICC3 than the TMR element 602b.

A bridge 614b includes TMR elements 604a, 604b. An output of the bridge 614b is the difference between a signal measured at node G and a signal measured at node H.

In one example, with a current source ICC4, the signal measured at node G and the signal measured at node H are each voltage signals. In another example, if the current source ICC4 is replaced with a fixed voltage source and the voltages are fixed at node G and node H, then the signal measured at node G and the signal measured at node H are each current signals.

The TMR element 604a and the TMR element 604b are electrically connected in series to form a first leg of the bridge 614a. The TMR element 604a is electrically closer in series to the current source ICC4 than the TMR element 604b.

The TMR element 604b and the TMR element 604a are electrically connected in series to form a second leg of the bridge 614b. The TMR element 604b is electrically closer in series to the current source ICC4 than the TMR element 604b.

In one example, the bridge 614a and the bridge 614b are examples of current bridges each having different sensitivities to a magnetic field from one another and different inner ranges from one another. The bridge 614a has the largest linear range and is used as an example of the current bridge 324 (FIG. 3).

Figure 6D:
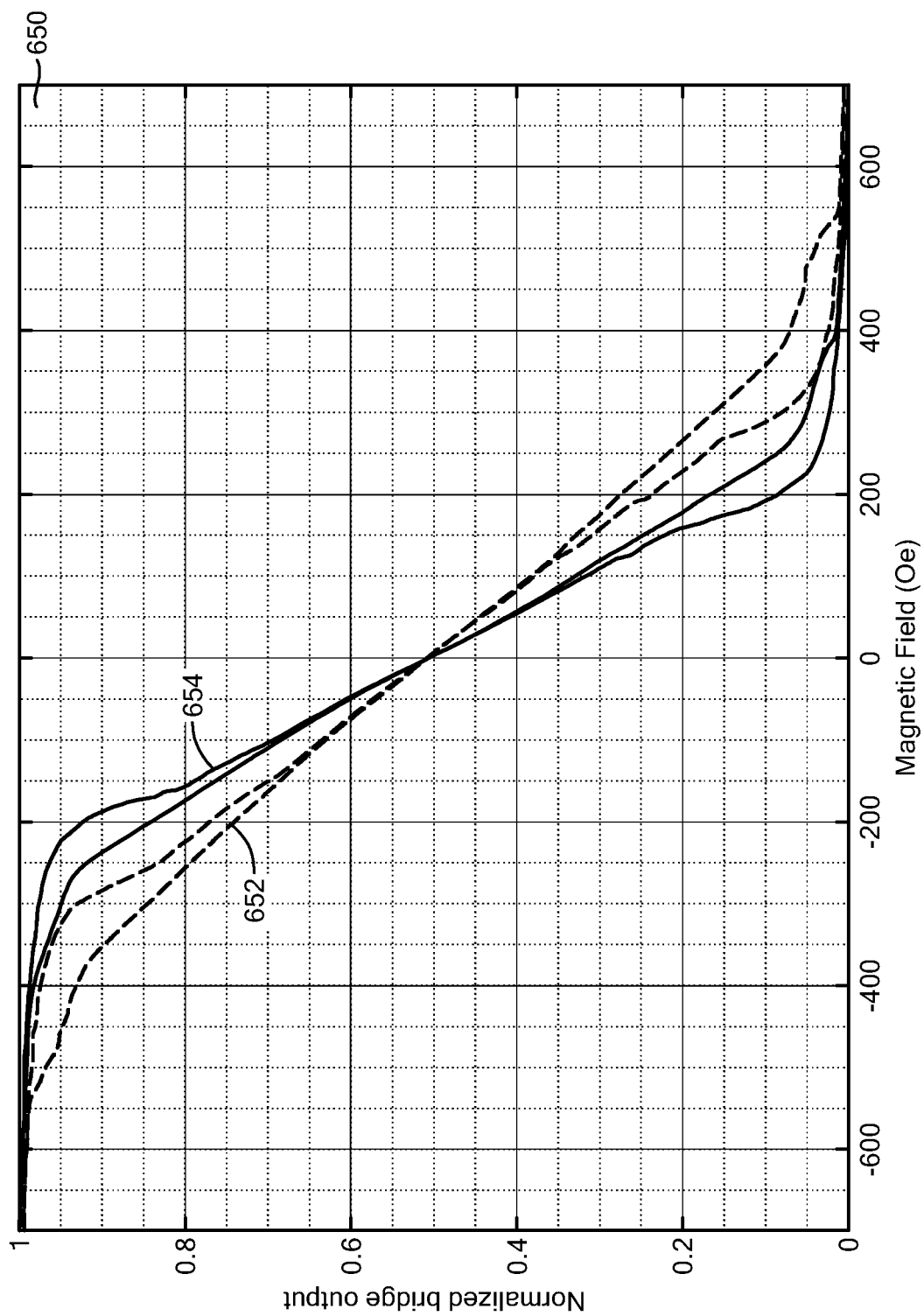
FIG. 6D is a graph of an example of outputs for the bridges in FIGS. 6B and 6C.

Referring to FIG. 6D, a graph 650 depicts a bridge output versus a magnetic field. For example, a curve 652 is an output of the bridge 614a (FIG. 6B) versus changes in the magnetic field, and a curve 654 is an output of the bridge 614b (FIG. 6B) versus changes in the magnetic field. An annihilation bridge such as the annihilation bridge 302' (FIG. 5B) may be used to detect if the bridge 614a is annihilated or not. Bridge 614a provides a measurement of the magnetic field. Based on this measurement it is known whether bridge 614b is annihilated or not.

Referring to FIG. 7A, a current sensor configuration 700 includes TMR elements (e.g., a TMR element 702a, a TMR element 702b, a TMR element 704a and a TMR element 704b) and a one-turn conductor 706. The TMR elements 702a, 702b, 704a, 704b each includes a free layer with a magnetic vortex. The current sensor configuration 700 may be used to account for temperature gradients in an integrated circuit where some TMR elements are exposed to more temperature gradients than other TMR elements.

TMR elements 702a, 704a, each include a reference direction that is the same direction. For example, the TMR element 702a has a reference direction 708a, the TMR element 704a has a reference direction 710a that are in the direction.

TMR elements 702b, 704b, each include a reference direction that is the same direction. For example, the TMR element 704a has a reference direction 708b, and the TMR element 704b has a reference direction 710b that are in the direction. The reference directions 708b, 710b are in a direction 180° different from the reference directions 708a, 710a.

The TMR elements 702a, 704b are on top of one end of the conductor 706 and the TMR elements disposed 702b, 704a are on top of the other end of the conductor 706. In one example, the TMR elements 702a, 702b, 704a, 704b may be separated from the conductor 706 by a distance between 50 and 200 microns.

In one example, the TMR element 702a and the TMR element 704b are separated by no less than 20 microns±5 microns. In one example, the TMR element 704a and the TMR element 702b are generally separated by 400 microns±100 microns. During operation, a current 716 is applied to one end of the conductor 706.

In one example, the TMR elements 702a, 704a may be on an axis 712a, and the TMR elements 702b, 704b may be on an axis 712b. In one example, the axis 712a is parallel to the axis 712b.

Referring to FIG. 7B, a current bridge 714 includes TMR elements 702a, 702b, 704a, 704b. An output of the bridge 714 is the difference between a signal measured at node I and a signal measured at node J.

In one example, with a current source ICC5, the signal measured at node I and the signal measured at node J are each voltage signals. In another example, if the current source ICC5 is replaced with a fixed voltage source and the voltages are fixed at node I and node J, then the signal measured at node I and the signal measured at node J are each current signals.

The TMR element 702a, 702b, 704a, 704b are electrically connected in series to form a first leg of the bridge 714. In one example, the TMR element 702a is electrically closer in series to the current source ICC5 than the TMR element 702b, the TMR element 702b is electrically closer in series to a current source ICC5 than the TMR element 704a, and the TMR element 704a is electrically closer in series to a current source ICC5 than the TMR element 704b.

The TMR element 704a, 704b, 702a, 702b are electrically connected in series to form a second leg of the bridge 714. In one example, the TMR element 704a is electrically closer in series to a current source ICC5 than the TMR element 704b, the TMR element 704b is electrically closer in series to a current source ICC5 than the TMR element 702a, and the TMR element 702a is electrically closer in series to a current source ICC5 than the TMR element 702b.

Referring to FIGS. 8A and 8B, a current sensor configuration 800 includes TMR elements (e.g., a TMR element 802a, a TMR element 802b, a TMR element 802c and a TMR element 802d) and a two-turn conductor 806. The TMR elements 802a, 802b, 802c, 802d each includes a free layer with a magnetic vortex.

TMR elements 802a, 802b, 802c, 802d each include a reference direction that is the same direction as the other TMR elements. For example, the TMR element 802a has a reference direction 810a, the TMR element 802b has a reference direction 810b, the TMR element 802c has a reference direction 810c, and the TMR element 802d has a reference direction 810d.

The TMR elements 802a, 802b, 802c, 802d are on top of the conductor 806. The TMR elements 802a, 802b, 802c, 802d are in the XY plane. During operation, a current 816 is applied to one end of the conductor 806. In one example, the TMR elements 802a, 802b, 802c, 802d may be separated from the conductor 606 by a distance between 50 and 200 microns.

The TMR element 802b is interleaved with the TMR element 802c. The distance between the TMR element 802a and the TMR element 802b is about the same as the distance between the TMR element 802b and the TMR 802d.

A bridge 814 includes TMR elements 802a, 802b, 802c, 802d. An output of the bridge 814 is the difference between a signal measured at node K and a signal measured at node L. In one example, the bridge 814 is an example of the current bridge 324 (FIG. 3).

In one example, with a current source ICC6, the signal measured at node K and the signal measured at node L are each voltage signals. In another example, if the current source ICC6 is replaced with a fixed voltage source and the voltages are fixed at node K and node L, then the signal measured at node K and the signal measured at node L are each current signals.

The TMR element 802a and the TMR element 802b are electrically connected in series to form a first leg of the bridge 814. The TMR element 802a is electrically closer in series to the current source ICC6 than the TMR element 802b.

The TMR element 802c and the TMR element 802d are electrically connected in series to form a second leg of the bridge 814. The TMR element 802c is electrically closer in series to the current source ICC6 than the TMR element 802d.

Figure 8C:
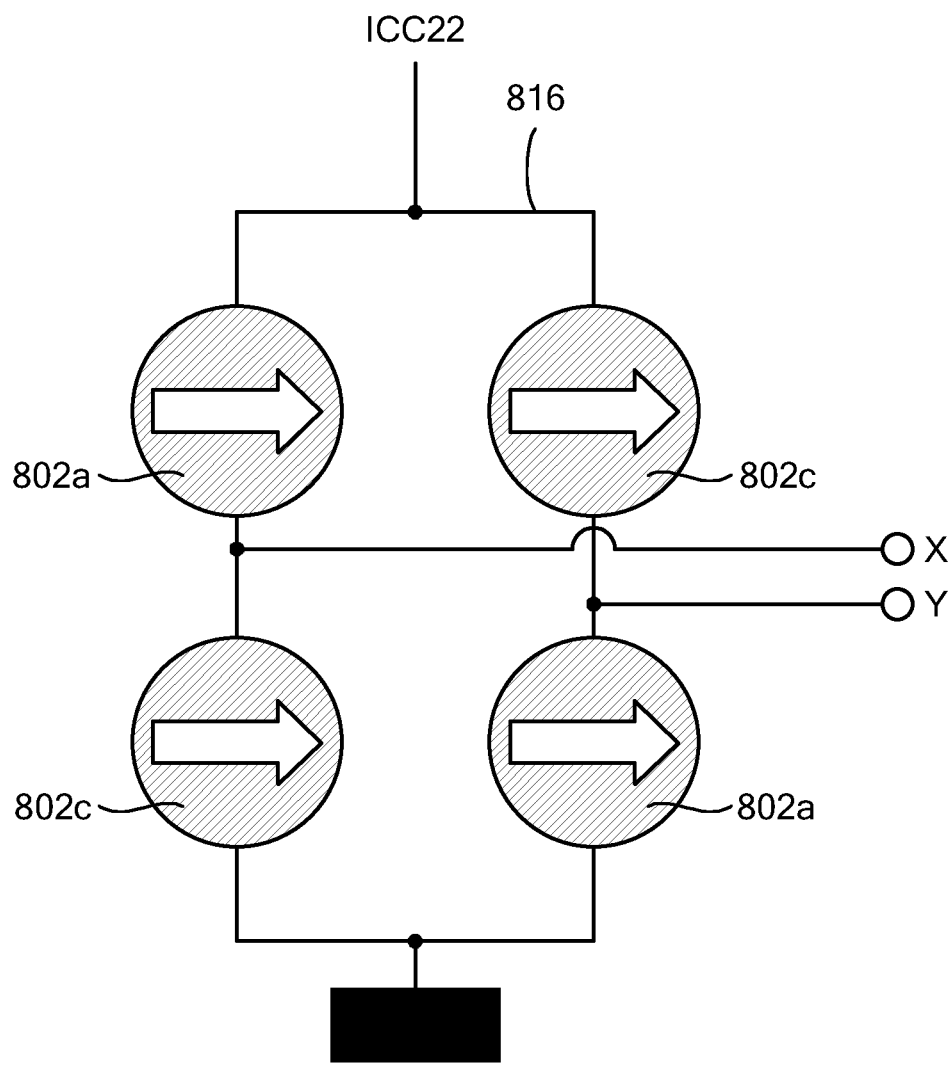
FIG. 8C is a diagram of a bridge using the TMR elements in FIG. 8A.

Referring to FIG. 8C, a bridge 816 includes TMR elements 802a, 802c. An output of the bridge 816 is the difference between a signal measured at node X and a signal measured at node Y. In one example, the bridge 816 is an example of the current bridge 324 (FIG. 3).

In one example, with a current source ICC22, the signal measured at node X and the signal measured at node Y are each voltage signals. In another example, if the current source ICC22 is replaced with a fixed voltage source and the voltages are fixed at node X and node Y, then the signal measured at node X and the signal measured at node Y are each current signals. The TMR element 802a and the TMR element 802c are electrically connected in series to form a first leg of the bridge 816. The TMR element 802a is electrically closer in series to the current source ICC22 than the TMR element 802c.

The TMR element 802c and the TMR element 802a are electrically connected in series to form a second leg of the bridge 816. The TMR element 802c is electrically closer in series to the current source ICC22 than the TMR element 802c.

In one example, the TMR element 802c may be replaced with the TMR element 802b in the bridge 816. In another example, the TMR element 802a may be replaced with the TMR element 802d in the bridge 816. In a further example, in the bridge 816, the TMR element 802c may be replaced with the TMR element 802b and the TMR element 802a may be replaced with the TMR element 802d.

In the current sensor configuration 800, common mode and gradient stray magnetic fields may be reduced along an X axis. Whatever the magnetic stray field distribution along the X axis, the magnetic stray field distribution can be decomposed in a Taylor series made of odd and even terms (where the TMR elements 802b, 802c are at X=0). In the following equations, only the common mode and the linear component are considered for simplicity. The signals coming from TMR elements 802a, 802b, 802c, 802d are, respectively, $Sig_A$, $Sig_B$, $Sig_C$, $Sig_D$, where:

$$Sig_A = Off + I \cdot Sens_I + \alpha \cdot H_0 - \alpha \cdot \delta x \cdot H_1$$

$$Sig_B = Sig_C = Off - I \cdot Sens_I + \alpha \cdot H_0$$

$$Sig_D = Off + I \cdot Sens_I + \alpha \cdot H_0 + \alpha \cdot \delta x \cdot H_1$$

and where:

Off is the base offset of the TMR element, $Sens_I$ is the sensitivity to the current flowing in the conductor 806, I is the current flowing in the conductor 806, $\alpha$ is the sensitivity to magnetic field, $H_0$ and $H_1$ are respectively the common mode stray field and the linear gradient of stray field, $\delta x$ is the distance between the TMR element 802a and the TMR element 802b, which is equal to the distance between the TMR element 802b and the TMR element 802d.

An output of the bridge 814 or the difference of the current at the nodes I and J is:

$$Output = (Sig_B + Sig_C) - (Sig_A + Sig_D)$$

$$= (2 \cdot Off - 2 \cdot I \cdot Sens_I + 2 \cdot \alpha \cdot H_0) - (2 \cdot Off + 2 \cdot I \cdot Sens_I + 2 \cdot \alpha \cdot H_0 - \alpha \cdot \delta x \cdot H_1 + \alpha \cdot \delta x \cdot H_1)$$

$$= -4 I \cdot Sens_I$$

By symmetry, the odd terms of the Taylor series are rejected, not just the linear gradient. Also, the differential bridge 816 rejects the even terms of the Taylor series of the stray field distribution (including common mode). So, depending on the stray field distribution symmetry, either the proposed construction or a simple differential field may be selected. In the case of current sensors, the stray magnetic field usually comes from adjacent current lines, so that the distribution of stray magnetic field is of the form 1/(x-xo) where xo is the distance to the current line. In the current sensor configuration 800, most of the stray magnetic field is held in the common mode and linear gradient; so that the current sensor configuration 800 will reject a larger amount of the stray magnetic field.

Figure 9:
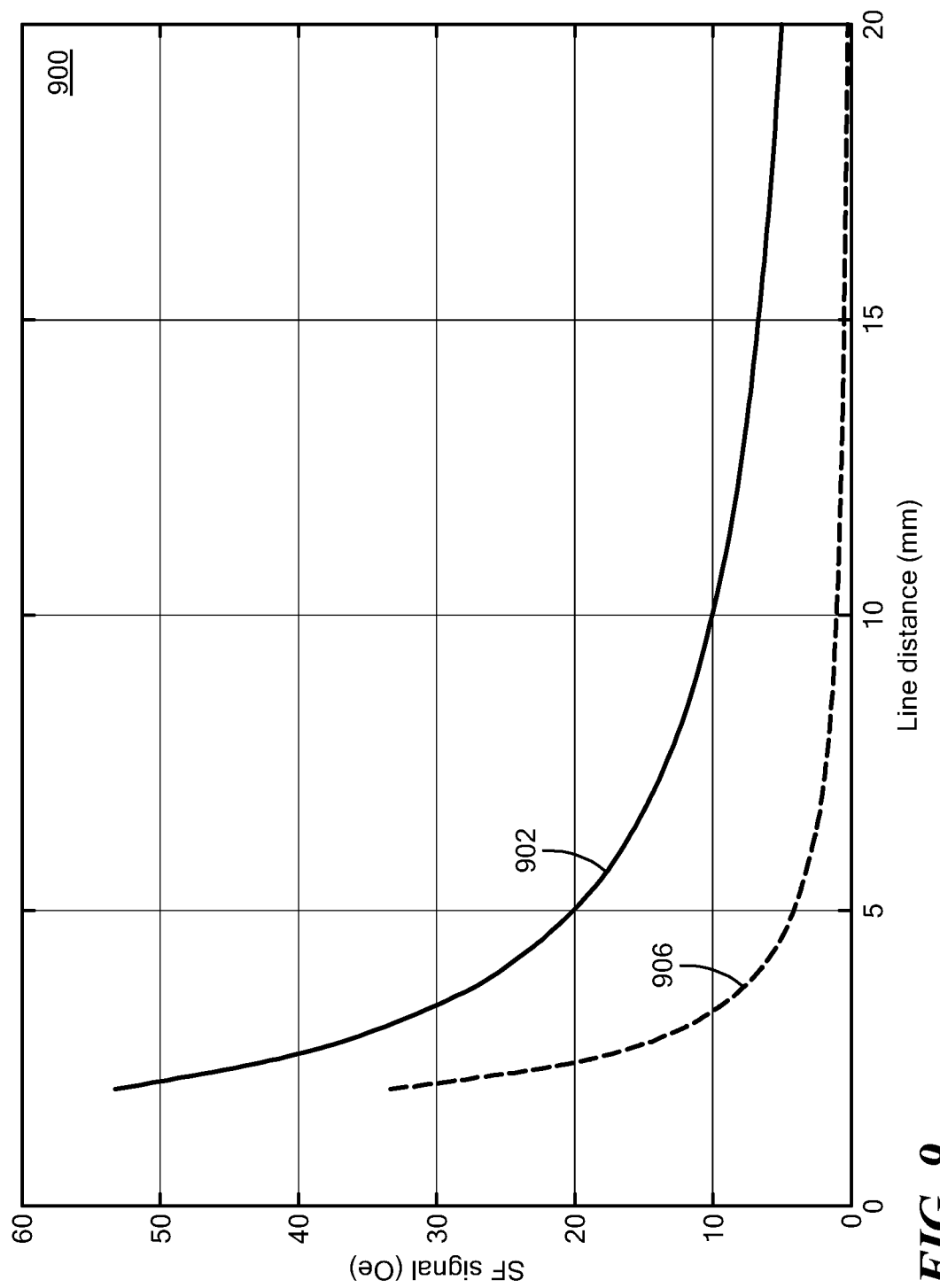
FIG. 9 is graph depicting a residual signal due to a nearby current line using a traditional differential current sensor configuration and the current sensor configuration of FIG. 8A.

Referring to FIG. 9, a graph 900 depicts unrejected stray magnetic field versus line distance. The curve 902 depicts traditional techniques to fabricate a current sensor. A curve 906 depicts a current sensor using the current sensor configuration 800.

Figure 10B:
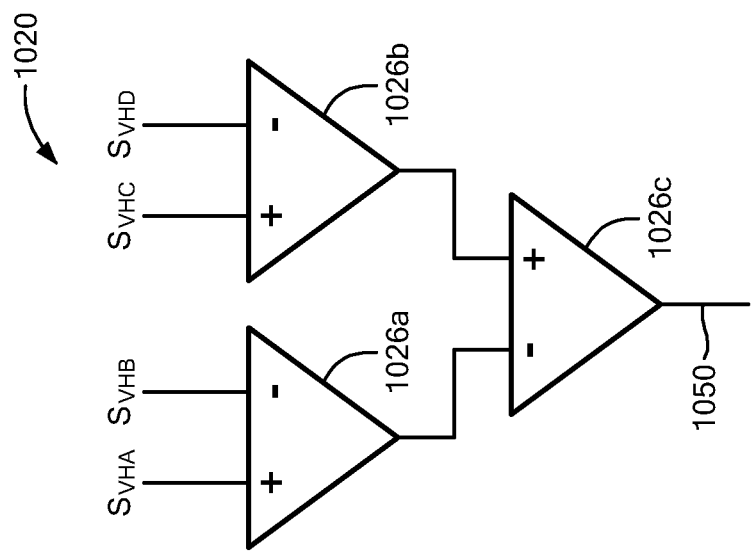
FIG. 10B is an example of a circuit to condition signals from the vertical Hall elements of FIG. 10A.
Figure 10A:
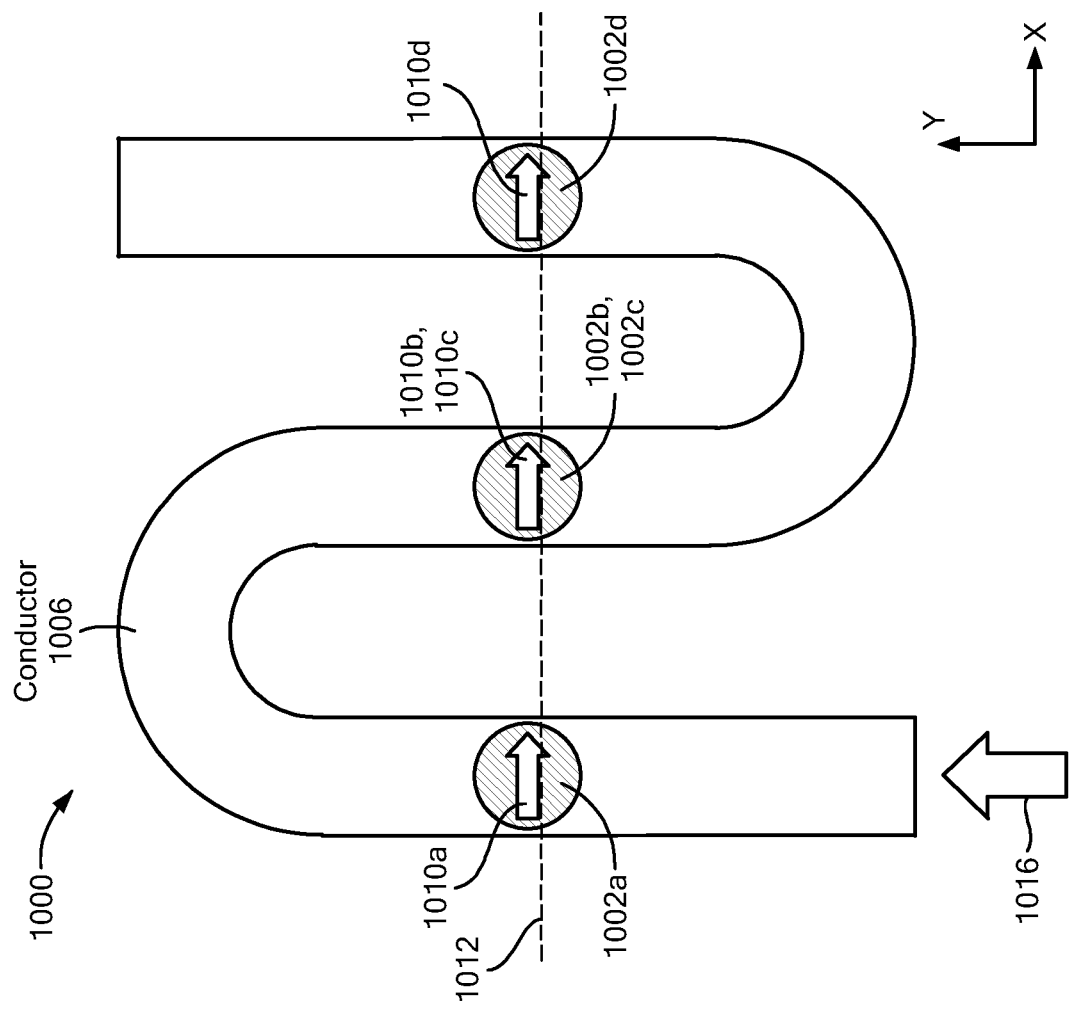
FIG. 10A is an example of a current sensor configuration including a conductor and vertical Hall elements.

Referring to FIG. 10A, a current sensor configuration 1000 is another example of the current sensor configuration 800 but using vertical Hall elements. The current sensor includes vertical Hall elements (e.g., a vertical Hall element 1002a, a vertical Hall element 1002b, a vertical Hall element 1002c and a vertical Hall element 1002d) and a two-turn conductor 1006.

The vertical Hall elements 1002a, 1002b, 1002c, 1002d each include a reference direction that is the same direction as the other vertical Hall elements. For example, the vertical Hall element 1002a has a reference direction 1010a, the vertical Hall element 1002b has a reference direction 1010b, the vertical Hall element 1002c has a reference direction 1010c, and the vertical Hall element 1002d has a reference direction 1010d.

The vertical Hall elements 1002a, 1002b, 1002c, 1002d are on top of the conductor 1006. The vertical Hall elements 1002a, 1002b, 1002c, 1002d are on a plane 1012 that extends into and out of FIG. 10A. During operation, a current 1016 is applied to one end of the conductor 1006. In one example, the TMR elements 1002a, 1002b, 1002c, 1002d may be separated from the conductor 1006 by a distance between 50 and 200 microns.

The vertical Hall element 1002b is placed side-by-side with the vertical Hall element 1002c. The distance between the TMR element 1002a and the vertical Hall element 1002b is about the same as the distance between the vertical Hall element 1002b and the vertical Hall element 1002d.

Referring to FIG. 10B, a circuit 1020 processes the signals from the vertical Hall elements to reduce the stray magnetic fields. A signal $S_{VHA}$ is an output signal of the vertical Hall element 1002a, a signal $S_{VHB}$ is an output signal of the vertical Hall element 1002b, a signal $S_{VHC}$ is an output signal of the vertical Hall element 1002c, and a signal $S_{VHD}$ is the output signal of the vertical Hall element 1002d. The signal $S_{PHB}$ is equal to the signal $S_{VHC}$.

The circuit 1020 includes a difference circuit 1026a, a difference circuit 1026b, and a difference circuit 1026c. The difference circuit 1026a takes the difference of signals $S_{VHA}$ and $S_{VHB}$ to produce an output signal equal to $S_{VHA} - S_{VHB}$. The difference circuit 1026b takes the difference of signals $S_{VHC}$ and $S_{VHD}$ to produce an output signal equal to $S_{VHC} - S_{VHD}$. The difference circuit 1026c takes the difference of signals $S_{VHA} - S_{VHB}$ and $S_{VHA} - S_{VHB}$ to produce an output signal 1050 equal to $(S_{VHC} - S_{VHD}) - (S_{VHA} - S_{VHB}) = 2S_{VHC} - S_{VHA} - S_{VHD}$.

Referring to FIG. 11A, a current sensor configuration 1100 includes planar Hall elements (e.g., a planar Hall element 1102a, a planar Hall element 1102b, a planar Hall element 1102c and a planar Hall element 1102d) and a three-turn conductor 1106.

The planar Hall elements 1102a, 1102b, 1102c, 1102d are between the turns of the conductor 1106. The planar Hall elements 1102a, 1102b, 1102c, 1102d are on a plane 1112 that extends into and out of FIG. 11A. During operation, a current 1116 is applied to one end of the conductor 1106.

The planar Hall element 1102b is placed side-by-side with the planar Hall element 1102c. The distance between the TMR element 1102a and the planar Hall element 1102b is about the same as the distance between the planar Hall element 1102b and the planar Hall element 1102d.

Referring to FIG. 11B, a circuit 1120 processes the signals from the vertical Hall elements to reduce the stray magnetic fields. A signal $S_{PHA}$ is an output signal of the vertical Hall element 1102a, a signal $S_{PHB}$ is an output signal of the vertical Hall element 1102b, a signal $S_{PHC}$ is an output signal of the vertical Hall element 1102c, and a signal $S_{PHD}$ is the output signal of the vertical Hall element 1102d. The signal $S_{PHB}$ is equal to the signal $S_{PHC}$.

The circuit 1120 includes a difference circuit 1126a, a difference circuit 1126b, and a difference circuit 1126c. The difference circuit 1126a takes the difference of signals $S_{PHA}$ and $S_{PHB}$ to produce an output signal equal to $S_{PHA}-S_{PHB}$. The difference circuit 1126b takes the difference of signals $S_{PHC}$ and $S_{PHD}$ to produce an output signal equal to $S_{PHC}-S_{PHD}$. The difference circuit 1126c takes the difference of signals $S_{PHA}-S_{PHB}$ and $S_{PHA}-S_{PHB}$ to produce an output signal 1150 equal to $(S_{PHC}-S_{PHD})-(S_{PHA}-S_{PHB})=2S_{PHC}-S_{PHA}-S_{PHD}$.

Having described embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field current sensor comprising:
    an annihilation detector comprising:
        an annihilation bridge comprising magnetoresistance elements;
        a current bridge comprising at least two of the magnetoresistance elements;
        a first comparator configured to compare an output signal from the annihilation bridge; and
        a second comparator configured to compare an output signal from the current bridge; and
        an OR circuit configured to receive an output signal from the first comparator and an output signal from the second comparator, the OR circuit configured to provide the output signal of the annihilation detector indicating whether or not a current sensor is operating in a linear range,
    wherein an output of the annihilation detector indicates whether an annihilation exists in one or more of the magnetoresistance elements using at least one of the outputs signals of the first and second comparators,
    wherein the magnetoresistance elements comprise a first tunneling magnetoresistance (TMR) element, a second TMR element, a third TMR element, and a fourth TMR element, each comprising a free layer forming a magnetic disk and having a reference direction in a first direction wherein the first TMR is formed in a first pillar having a first diameter, the second TMR element is formed in a second pillar having the first diameter, the third TMR element is formed in a third pillar having a second diameter larger different from the first diameter, and the fourth TMR element is formed in a fourth pillar having the second diameter, wherein the first diameter is smaller than the second diameter, wherein the first TMR element, the second TMR element, the third TMR element and the fourth TMR element are on top of a one-turn conductor, wherein the first TMR element and the third TMR element are on top of one end of the conductor,
    wherein the second TMR element and the fourth TMR element are on top of the other end of the conductor, wherein a first bridge comprises the first TMR element and the second TMR element forming a first leg of the first bridge with the first TMR element electrically closer in series to a first current source than the second TMR element,
    wherein the first bridge further comprises the first TMR element and the second TMR element forming a second leg of the first bridge with the second TMR element electrically closer in series to the first current source than the first TMR element,
    wherein a second bridge comprises the third TMR element and the fourth TMR element forming a first leg of the second bridge with the third TMR element electrically closer in series to a second current source than the fourth TMR element,
    wherein the second bridge further comprises the third TMR element and the fourth TMR element forming a second leg of the second bridge with the fourth TMR element electrically closer in series to the second current source than the third TMR element,
    wherein one of the first bridge or the second bridge is the annihilation bridge.

2. The magnetic field current sensor of claim 1, wherein a distance between the first TMR element and the third TMR element is about 20 microns, and
    wherein a distance between the first TMR element and the second TMR element is about 400 microns.

3. The magnetic field current sensor of claim 1, wherein the other one of the first bridge or the second bridge is the current bridge.

4. The magnetic field current sensor of claim 1, wherein the first TMR element is part of a first leg of the annihilation bridge,
    wherein the second TMR element is part of a second leg of the annihilation bridge,
    wherein the third TMR element is part of the first leg of the annihilation bridge, and
    wherein the fourth TMR element is part of the second leg of the annihilation bridge.

5. The magnetic field current sensor of claim 4, wherein the first TMR element and second TMR element are on top of a one-turn conductor.

6. The magnetic field current sensor of claim 1, wherein the first TMR element, the second TMR element, the third TMR element and the fourth TMR element are on top of a one-turn conductor.

7. The magnetic field current sensor of claim 6, wherein the first TMR element and the fourth TMR element are on top of one end of the conductor,
    wherein the second TMR element and the third TMR element are on top of the other end of the conductor.

8. The magnetic field current sensor of claim 7, wherein the first TMR element and the third TMR element are on a first axis,
    wherein the second TMR element and the fourth TMR element are on a second axis,
    wherein the first axis is parallel to the second axis.

9. A magnetic field current sensor comprising:
    an annihilation detector comprising:
        an annihilation bridge comprising magnetoresistance elements;
        a current bridge comprising at least two of the magnetoresistance elements;
        a first comparator configured to compare an output signal from the annihilation bridge; and
        a second comparator configured to compare an output signal from the current bridge; and
        an OR circuit configured to receive an output signal from the first comparator and an output signal from the second comparator, the OR circuit configured to provide the output signal of the annihilation detector indicating whether or not a current sensor is operating in a linear range, wherein an output of the annihilation detector indicates whether an annihilation exists in one or more of the magnetoresistance elements using at least one of the outputs signals of the first and second comparators, wherein the magnetoresistance elements comprise a first tunneling magnetoresistance (TMR) element, a second TMR element, a third TMR element, and a fourth TMR element, each comprising a free layer forming a magnetic disk, wherein the first TMR element, the second TMR element, the third TMR element and the fourth TMR element are on top of a one-turn conductor, wherein the first TMR element and the fourth TMR element are on top of one end of the conductor, wherein the second TMR element and the third TMR element are on top of the other end of the conductor, wherein the first TMR element and the third TMR element are on a first axis, wherein the second TMR element and the fourth TMR element are on a second axis, wherein the first axis is parallel to the second axis, wherein, on the first leg, the first TMR element is electrically closer in series to a first current source than the second TMR element, the second TMR element is electrically closer in series to the first current source than the third TMR element, and the third TMR element is electrically closer in series to the first current source than the fourth TMR element, wherein, on the second leg, the third TMR element is electrically closer in series to the first current source than the fourth TMR element, the fourth TMR element is electrically closer in series to the first current source than the first TMR element, and the first TMR element is electrically closer in series to the first current source than the second TMR element, wherein the first bridge is one of the annihilation bridge or the current bridge.

* * * * *

UNITED STATES PATENT AND TRADEMARK OFFICE
CERTIFICATE OF CORRECTION

PATENT NO. : 12,130,342 B2  
APPLICATION NO. : 17/806336  
DATED : October 29, 2024  
INVENTOR(S) : Rémy Lassalle-Balier et al.

Page 1 of 1

It is certified that error appears in the above-identified patent and that said Letters Patent is hereby corrected as shown below:

In the Specification

Column 8, Line 50, delete "Hs F" and replace with --$H_{SF}$--.

Column 8, Line 55, delete "H D" and insert --$H_D$--.

Column 10, Line 12, delete "to 6B," and replace with --to FIG. 6B,--.

Column 14, Line 32, delete "$S_{PHB}$" and replace with --$S_{VHB}$--.

Signed and Sealed this  
Twenty-ninth Day of April, 2025

Coke Morgan Stewart  
*Acting Director of the United States Patent and Trademark Office*